US010418427B2

(12) United States Patent
Goto et al.

(10) Patent No.: US 10,418,427 B2
(45) Date of Patent: Sep. 17, 2019

(54) METHOD FOR MANUFACTURING ORGANIC EL DISPLAY PANEL

(71) Applicant: JOLED INC., Tokyo (JP)

(72) Inventors: Masashi Goto, Tokyo (JP); Takao Nagumo, Osaka (JP); Takayuki Miyoshi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/513,643

(22) PCT Filed: Sep. 25, 2015

(86) PCT No.: PCT/JP2015/004865
§ 371 (c)(1),
(2) Date: Mar. 23, 2017

(87) PCT Pub. No.: WO2016/047144
PCT Pub. Date: Mar. 31, 2016

(65) Prior Publication Data
US 2017/0301740 A1    Oct. 19, 2017

(30) Foreign Application Priority Data

Sep. 25, 2014  (JP) ................................ 2014-195284

(51) Int. Cl.
*H01L 27/32*     (2006.01)
*B41J 2/045*     (2006.01)
(Continued)

(52) U.S. Cl.
CPC ........ *H01L 27/3246* (2013.01); *B41J 2/0451* (2013.01); *B41J 2/04586* (2013.01);
(Continued)

(58) Field of Classification Search
None
See application file for complete search history.

(56) References Cited

U.S. PATENT DOCUMENTS 5,443,922 A     8/1995  Nishizaki et al.
5,771,051 A *   6/1998  Guenther ............... B41J 2/0451
                                                       347/14
(Continued)

FOREIGN PATENT DOCUMENTS

JP     05-163488     6/1993
JP     2001-194519   7/2001
(Continued)

OTHER PUBLICATIONS

English translation, "Discharge method for functional fluid, manufacturing method for organic el element, manufacturing method for color filter, organic el device and electronic apparatus," Atsuchi Kitabayashi. 27 pgs. Retrieved from internet on Sep. 18, 2017 <https://patents.google.com/patent/JP2014013685A/en>.*

(Continued)

*Primary Examiner* — David E Graybill
(74) *Attorney, Agent, or Firm* — Greenblum & Bernstein P.L.C.

(57) ABSTRACT

Forming functional layers including functional material in application regions by applying ink to the application regions then drying the ink, which contains the functional material, by causing nozzles to be scanned relative to the substrate along the row direction while, among the nozzles, only use-nozzles that are not selected as a defective nozzle eject the ink, the nozzles being arranged in the column direction over the substrate and including a nozzle selected in advance as a defective nozzle. Among the nozzles, when applying the ink, at least one reserve nozzle is present, a reserve nozzle being a nozzle that is not one of the use-nozzles, is not selected as the defective nozzle, passes over the application region, and does not eject the ink.

9 Claims, 16 Drawing Sheets

(51) Int. Cl.
  *H01L 51/00* (2006.01)
  *H01L 51/56* (2006.01)
  *B41J 2/21* (2006.01)
  *B41J 2/51* (2006.01)
  *H01L 51/52* (2006.01)

(52) U.S. Cl.
  CPC ............... *B41J 2/2139* (2013.01); *B41J 2/51* (2013.01); *H01L 27/3211* (2013.01); *H01L 51/0005* (2013.01); *H01L 51/56* (2013.01); *H01L 51/0021* (2013.01); *H01L 51/5206* (2013.01); *H01L 51/5221* (2013.01); *H01L 2227/323* (2013.01)

(56) References Cited

U.S. PATENT DOCUMENTS

| | | | | |
|---|---|---|---|---|
| 6,347,857 | B1* | 2/2002 | Purcell | B41J 2/16579 347/19 |
| 6,866,359 | B2* | 3/2005 | Pan | B41J 2/04506 347/19 |
| 6,991,315 | B2* | 1/2006 | Nakamura | H05B 33/10 347/12 |
| 7,247,339 | B2* | 7/2007 | Newsome | B41J 11/46 347/107 |
| 7,314,264 | B2* | 1/2008 | Sato | B41J 2/2128 347/19 |
| 7,410,244 | B2* | 8/2008 | Kawase | B41J 2/505 347/43 |
| 7,703,887 | B2* | 4/2010 | Kawase | B41J 2/505 347/43 |
| 7,851,020 | B2* | 12/2010 | Nagae | B41J 2/14233 347/12 |
| 7,901,741 | B2* | 3/2011 | Katagami | B41J 2/155 427/466 |
| 8,001,923 | B2* | 8/2011 | Kawase | B41J 2/485 118/313 |
| 8,119,186 | B2* | 2/2012 | Sakai | B41J 2/04541 427/256 |
| 8,181,595 | B2* | 5/2012 | Kojima | B41J 2/1652 118/302 |
| 8,211,493 | B2* | 7/2012 | Kawase | B41J 2/485 427/466 |
| 8,344,362 | B2* | 1/2013 | Kitabayashi | H01L 27/326 257/40 |
| 8,440,253 | B2* | 5/2013 | Hanaoka | G01B 11/00 427/64 |
| 8,766,288 | B2* | 7/2014 | Chen | H01L 27/3279 257/88 |
| 8,791,881 | B2* | 7/2014 | Kanegae | H01L 27/3246 315/169.3 |
| 8,864,261 | B2* | 10/2014 | Kitabayashi | B41J 2/04506 347/10 |
| 8,901,594 | B2* | 12/2014 | Nakatani | H01L 27/3223 257/40 |
| 8,944,564 | B2* | 2/2015 | Cho | H05B 33/10 347/40 |
| 8,994,264 | B2* | 3/2015 | Cho | H01L 51/0004 313/504 |
| 8,995,022 | B1* | 3/2015 | Vronsky | H01L 51/0005 257/40 |
| 9,010,899 | B2* | 4/2015 | Harjee | H01L 51/0005 347/14 |
| 9,024,525 | B2* | 5/2015 | Furuie | H01L 51/5284 313/503 |
| 9,130,197 | B2* | 9/2015 | Kim | H01L 51/56 |
| 9,153,628 | B2* | 10/2015 | Takeuchi | H01L 51/5088 |
| 9,337,426 | B2* | 5/2016 | Dowling | H01L 51/0005 |
| 9,365,032 | B2* | 6/2016 | Kitabayashi | B41J 2/04508 |
| 9,722,005 | B2* | 8/2017 | Wang | H01L 27/3246 |
| 2003/0054186 | A1* | 3/2003 | Miyashita | H01L 27/3211 428/500 |
| 2003/0142167 | A1* | 7/2003 | Nakamura | H05B 33/10 347/37 |
| 2003/0186613 | A1* | 10/2003 | Kawase | B41J 2/14032 445/60 |
| 2005/0177343 | A1* | 8/2005 | Nagae | B41J 29/393 702/183 |
| 2006/0252185 | A1* | 11/2006 | Kwon | B41J 3/28 438/129 |
| 2007/0109606 | A1* | 5/2007 | Nagae | H04N 1/4015 358/3.26 |
| 2007/0228382 | A1* | 10/2007 | Yamazaki | H01L 51/5253 257/72 |
| 2008/0158276 | A1* | 7/2008 | Kubota | B41J 2/04508 347/10 |
| 2008/0317941 | A1* | 12/2008 | Hanaoka | B41J 2/04526 427/58 |
| 2009/0015608 | A1* | 1/2009 | Han | B41J 2/0451 347/9 |
| 2009/0117261 | A1* | 5/2009 | Sakai | B41J 2/04541 427/66 |
| 2009/0128020 | A1* | 5/2009 | Takei | H01L 27/3223 313/504 |
| 2009/0215350 | A1* | 8/2009 | Takei | H01L 27/3246 445/23 |
| 2010/0096988 | A1* | 4/2010 | Kitabayashi | H01L 27/326 315/51 |
| 2010/0255746 | A1* | 10/2010 | Hanaoka | G01B 11/00 445/24 |
| 2010/0311298 | A1 | 12/2010 | Suzuki et al. | |
| 2012/0249636 | A1* | 10/2012 | Kitabayashi | B41J 2/04506 347/10 |
| 2014/0176631 | A1* | 6/2014 | Kitabayashi | B41J 2/04508 347/14 |
| 2014/0197385 | A1* | 7/2014 | Madigan | H01L 51/56 257/40 |

FOREIGN PATENT DOCUMENTS

| | | |
|---|---|---|
| JP | 2003-251243 | 9/2003 |
| JP | 2004-362818 | 12/2004 |
| JP | 2008-209439 | 9/2008 |
| JP | 2011-018632 | 1/2011 |
| JP | 2013-187000 | 9/2013 |
| JP | 2014-013685 | 1/2014 |

OTHER PUBLICATIONS

International Search Report, dated Dec. 8, 2015 by the Japan Patent Office, for the corresponding International Application No. PCT/JP2015/004865.

* cited by examiner

METHOD FOR MANUFACTURING ORGANIC EL DISPLAY PANEL

TECHNICAL FIELD

The present invention relates to methods for manufacturing organic electroluminescence (EL) display panels in which organic EL elements are arranged, and in particular to methods for manufacturing organic EL display panels by using inkjet methods.

BACKGROUND ART

In an organic EL display panel in which organic EL elements are arranged in a matrix on a substrate, light emitted from organic EL elements is used as pixels to display an image.

An organic EL element has a structure in which a functional layer including a functional material, for example an organic light-emitting layer including an organic light-emitting material, is sandwiched between a pair of electrodes. Aside from an organic light-emitting layer, a functional layer may be a hole or electron injection layer, a hole or electron transport layer, a hole or electron blocking layer, a buffer layer, etc., the function of which may be determined by a functional material contained within and by a relationship with an adjacent layer.

Methods of forming such layers are broadly separated into dry processes such as vacuum deposition and wet processes such as inkjet printing. A wet process is a method using an ink in which a functional material is contained in an organic solvent, and when considering formation accuracy and cost of a functional layer, is regarded as a technique suitable for high resolution and large sizes of organic EL display panels. In particular, among wet processes, development is progressing in inkjet methods in which ink is ejected onto an application region where a functional layer is formed while a nozzle capable of ejecting ink as minute droplets is caused to scan along a top surface of the substrate (for example, see Patent Literature 1).

In such an inkjet method, a plurality of nozzles aligned in a row are used for production efficiency, but as resolution and size of display panels increase, the number of nozzles used reaches several tens of thousands. Among this large number of nozzles, adhesion of dried ink or foreign matter may generate defective nozzles for which ink application location or application amount deviates greatly from set values and for which correction is impossible. In the case of a defective nozzle, a supplementary method is used in which ink ejection from the defective nozzle is not performed, and an application amount from a neighboring nozzle is used instead. For example, there is a method of increasing the number of times ink is applied to the same application region by a nozzle adjacent to a defective nozzle (for example, see Patent Literature 2).

CITATION LIST

Patent Literature

[Patent Literature 1] JP 2004-362818
[Patent Literature 2] JP 2011-18632

SUMMARY OF INVENTION

Technical Problem

The number of times each nozzle can apply ink to the same application region is increasingly limited as resolution of display panels increases. Accordingly, as disclosed in Patent Literature 2, for example, there is a corresponding limit to the method of increasing the number of times a nozzle adjacent to a defective nozzle applies ink to an application region.

Here, a method may be considered of shortening the shortest ejection interval of nozzles to increase the number of times ink can be applied to one application region of one nozzle, but this method leads to a decrease in manufacturing efficiency or a great change in manufacturing processes. Further, a method may be considered of increasing an amount of ink ejected at one time from a nozzle other than a defective nozzle, in accordance with the number of occurrences of defective nozzles, but such a method makes control of nozzles complex.

Thus, an object of the present invention is to provide a method for manufacturing an organic EL display panel that can supplement a decrease in ink application amount due to occurrence of a defective nozzle by a method that is simple and suppresses a decrease in manufacturing efficiency.

Solution to Problem

A method for manufacturing an organic EL display panel pertaining to one aspect of the present invention is a method comprising: preparing a substrate; forming first electrodes on the substrate in a matrix in which a row direction and a column direction are determined; forming banks on the substrate that partition the first electrodes into columns, each column extending along the column direction and each region between adjacent ones of the banks being an application region, thereby forming application regions between adjacent ones of the banks, the application regions being aligned along the row direction; forming functional layers including functional material in the application regions by applying ink to the application regions then drying the ink, which contains the functional material, by causing nozzles to be scanned relative to the substrate along the row direction while, among the nozzles, only use-nozzles that are not selected as a defective nozzle eject the ink, the nozzles being arranged in the column direction over the substrate and including a nozzle selected in advance as a defective nozzle; and forming a second electrode covering the functional layers, wherein among the nozzles, when applying the ink, at least one reserve nozzle is present, a reserve nozzle being a nozzle that is not one of the use-nozzles, is not selected as the defective nozzle, passes over the application region, and does not eject the ink.

Advantageous Effects of Invention

According to the method for manufacturing an organic EL display panel pertaining to the aspect above, even if a defective nozzle occurs among the nozzles, a decrease in ink application amount can be supplemented by changing a reserve nozzle to a use-nozzle. In other words, according to the manufacturing method, a decrease in ink application amount due to occurrence of a defective nozzle can be supplemented by a method that is simple and suppresses a decrease in manufacturing efficiency.

BRIEF DESCRIPTION OF DRAWINGS

FIG. 4A showing formation of a first electrode and a hole injection layer; FIG. 4B showing formation of a pixel restriction layer; and FIG. 4C showing formation of banks.

FIG. 5A showing ink application in formation of a hole transport layer; FIG. 5B showing ink drying in formation of the hole transport layer; and FIG. 5C showing formation an organic light-emitting layer.

FIG. 6A showing formation of an electron transport later; FIG. 6B showing formation of a second electrode; and FIG. 6C showing formation of a thin film sealing layer.

FIG. 10A is for describing a state prior to defective nozzle occurrence; and FIG. 10B is for describing a state after defective nozzle occurrence.

FIG. 17A is for describing a state prior to defective nozzle occurrence; and FIG. 17B is for describing a state after defective nozzle occurrence.

FIG. 18A is for describing a state prior to defective nozzle occurrence; and FIG. 18B is for describing a state after defective nozzle occurrence.

DESCRIPTION OF EMBODIMENTS

<Developments that Led to One Aspect of the Present Invention>

Figure 17A:
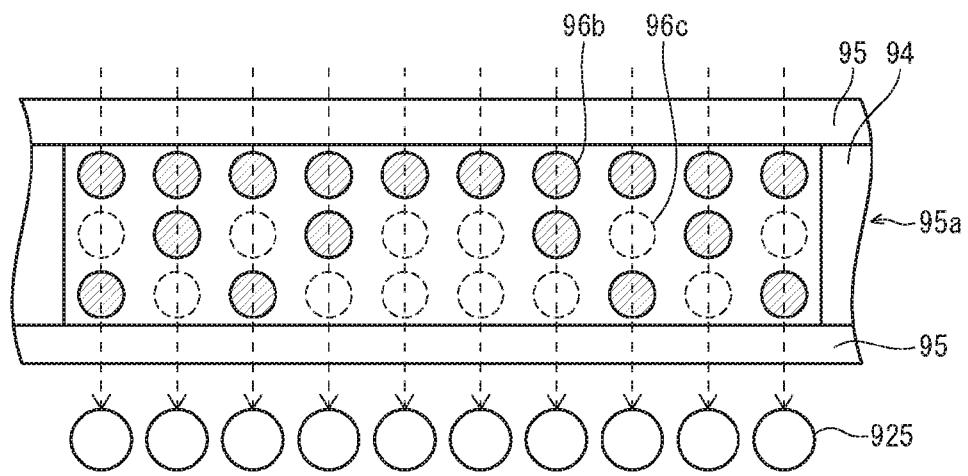
FIG. 17A and FIG. 17B are schematic plan views for describing ink application.
Figure 17B:
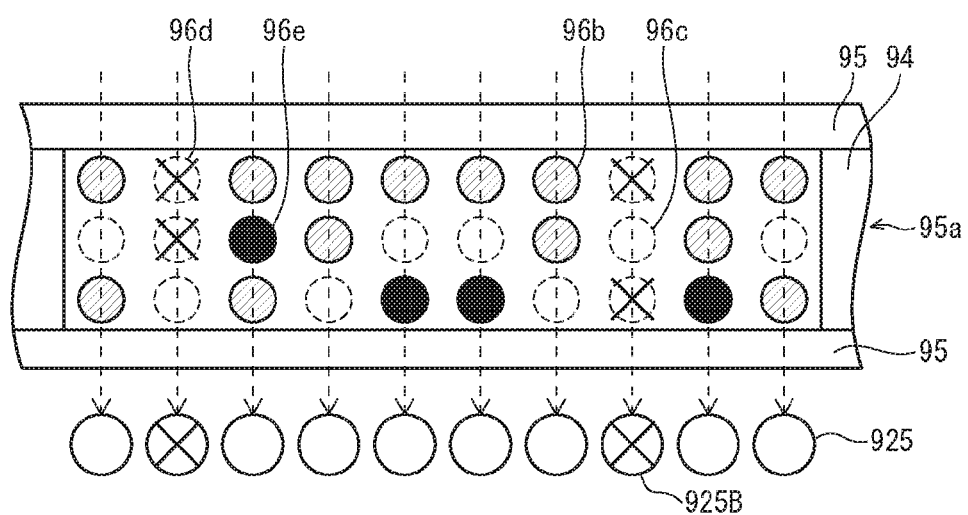

As stated above, according to an inkjet method, ink is applied to a substrate by using several tens of thousands of nozzles. In this case, if nozzle maintenance (nozzle cleaning, ink replacement) is performed when a certain degree of small scale nozzle defects occurs, maintenance time increases, and manufacturing efficiency is decreased. Thus, typically, when defective nozzles occur on a small scale, ink ejection from defective nozzles is stopped and ink application to the substrate is continued. However, when ink ejection from defective nozzles is simply stopped, ink application amount decreases, ink application unevenness occurs, and wetting defects occur. Thus, in this case, it is necessary to supplement a decrease in ink application amount caused by defective nozzle occurrence. An example of such a supplement method is described using FIG. 17A and FIG. 17B. FIG. 17A and FIG. 17B are schematic plan views for describing ink application; FIG. 17A is for describing a state prior to defective nozzle occurrence; and FIG. 17B is for describing a state after defective nozzle occurrence.

In FIG. 17A and FIG. 17B, an application region 95a is formed as a region between banks 95 on a substrate, and an insulating layer (pixel restriction layer) 94 that is electrically insulating and lower than the banks 95 is formed in the application region 95a. A plurality (10 in FIG. 17A and FIG. 17B) of nozzles 925 that eject ink are arranged in a row across the diagram, and ink is applied to the application region 95a by ejecting ink from the nozzles 925 while the nozzles 925 move from top to bottom of the diagram. Ink application locations 96b that result from ejection by the nozzles 925 are indicated by hatched circles in the application region 95a. The application locations 96b do not indicate a wet state after ink application, but only locations of application. That is, ink applied to the application locations 96b flows to fill the application region 95a, uniformly wetting the application region 95a.

Each of the nozzles 925 is assumed to capable of ejecting ink three times into the application region 95a. That is, in the range of the application region 95a shown in FIG. 17A and FIG. 17B, 30 locations exist to which the nozzles 925 can apply ink. Note that the number of times each of the nozzles 925 can eject ink into the application region 95a is determined by a relationship between a minimum ejection interval of the nozzles 925 and spacing between adjacent ones of the banks 95.

Of these 30 possible ink application locations, the nozzles 925 only eject ink to the application locations 96b, which are pre-determined. That is, non-application locations 96c exist in the application region 95a, to which application is possible but the nozzles 925 do not eject ink, and these are indicated by circles with dotted outlines and no hatching.

Here, a case is considered in which defective nozzles 925B occur among the nozzles 925 (indicated by a cross), and a portion of the application locations 96b become additional non-application locations 96d (indicated by a cross). More specifically, in FIG. 17B, two defective nozzles 925B occur, and four application locations 96b become additional non-application locations 96d. When defective nozzles 925B occur and additional non-application locations 96d increase in such a way, an amount of ink applied to the application region 95a decreases.

However, in FIG. 17B, the number of applications from other ones of the nozzles 925 is increased and four non-application locations 96c become alternative ejection locations 96e according to a supplement setting, thereby supplementing the decrease in ink application amount. As stated above, ink can flow within the application region 95a, and therefore even if the additional non-application locations 96d and the alternative ejection locations 96e are different locations, occurrence of application unevenness and wetting defects can be suppressed.

Figure 18A:
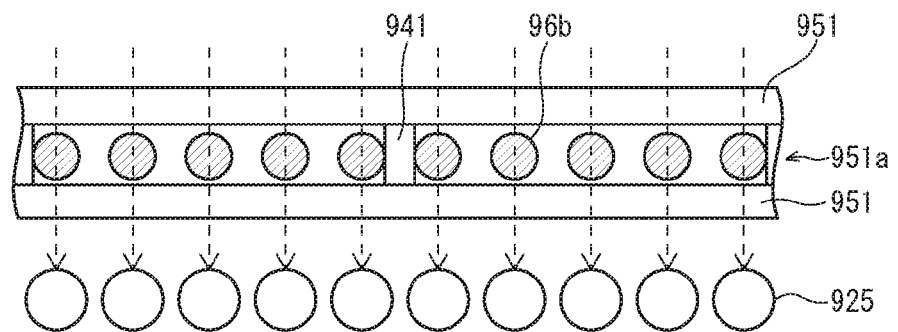
FIG. 18A and FIG. 18B are schematic plan views for describing ink application.
Figure 18B:
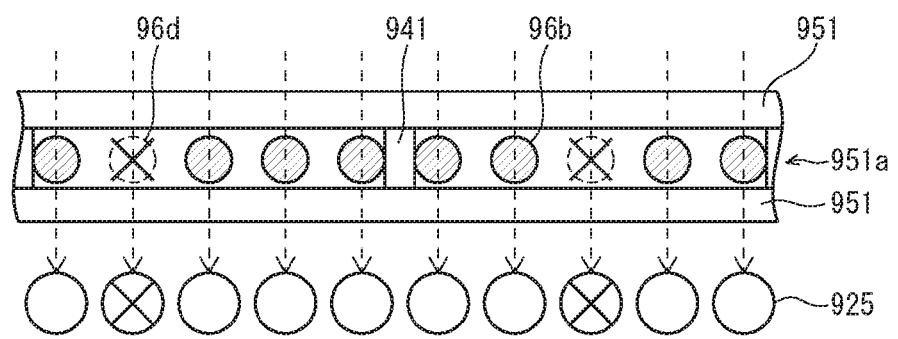

However, progress is being in increasing resolution of organic EL display panels and accordingly, application regions are becoming smaller. FIG. 18A and FIG. 18B are schematic plan views for describing ink application in a high resolution organic EL display panel; FIG. 18A is for describing a state prior to defective nozzle occurrence; and FIG. 18B is for describing a state after defective nozzle occurrence.

In FIG. 18A and FIG. 18B, like in FIG. 17A and FIG. 17B, an application region 951a is formed as a region between banks 951, and an insulating layer (pixel restriction layer) 941 is formed in the application region 951a. However, in FIG. 18A and FIG. 18B, compared with FIG. 17A and FIG. 17B, spacing between the banks 951 is smaller, and each of the nozzles 925 can only eject ink once in the application region 95a. Therefore, as shown in FIG. 18A, the nozzles 925 cannot secure the non-application locations 96c according to the method of ink application described with reference to FIG. 17A and FIG. 17B.

Accordingly, when defective nozzles 925B occur, as shown in FIG. 18B, alternative ejection locations 96e cannot be set for the additional non-application locations 96d. Accordingly, a decrease in ink application amount due to defective nozzles 925B cannot be supplemented.

In response to such a problem, a method may be considered of increasing the number of times ink can be applied from each nozzle into the application region, by shortening the shortest ejection interval of nozzles according to spacing of banks. The shortest ejection interval of nozzles is determined by scanning speed of the nozzles over the substrate, and a maximum ejection frequency of the nozzles.

However, reducing nozzle scanning speed corresponds to increasing time required for ink application, and is not desirable in terms of manufacturing efficiency. Further, increasing maximum ejection frequency of nozzles can cause a decrease in application accuracy and deterioration in ink exhaustion, and therefore it becomes necessary to make substantial changes in manufacturing processes such as increasing inkjet device performance and improving ink.

Further, as a method other than shortening the shortest ejection interval of nozzles, a method may be considered of increasing an amount of ink ejected at one time from nozzles other than defective nozzles. However, according to a method of changing an amount of ink ejected each time a defective nozzle occurs, nozzle control becomes complex— in addition to increasing management for each nozzle, it becomes necessary to adjust application locations and shortest ejection intervals according to ejection amounts, for example.

In view of the above, the inventors of the present application arrived at a method for manufacturing an organic EL display panel that is one aspect of the invention described below, which supplements a decrease in ink application due to occurrence of a defective nozzle by a simple method that also suppresses a decrease in manufacturing efficiency.

<Summary of One Aspect of the Present Invention>

The manufacturing method for manufacturing an organic EL display panel pertaining to one aspect of the present invention is a method comprising: preparing a substrate; forming first electrodes on the substrate in a matrix in which a row direction and a column direction are determined; forming banks on the substrate that partition the first electrodes into columns, each column extending along the column direction and each region between adjacent ones of the banks being an application region, thereby forming application regions between adjacent ones of the banks, the application regions being aligned along the row direction; forming functional layers including functional material in the application regions by applying ink to the application regions then drying the ink, which contains the functional material, by causing nozzles to be scanned relative to the substrate along the row direction while, among the nozzles, only use-nozzles that are not selected as a defective nozzle eject the ink, the nozzles being arranged in the column direction over the substrate and including a nozzle selected in advance as a defective nozzle; and forming a second electrode covering the functional layers, wherein among the nozzles, when applying the ink, at least one reserve nozzle is present, a reserve nozzle being a nozzle that is not one of the use-nozzles, is not selected as the defective nozzle, passes over the application region, and does not eject the ink.

According to the manufacturing method, even if a defective nozzle occurs among the nozzles, a decrease in ink application amount can be supplemented by changing a reserve nozzle to a use-nozzle. In other words, according to the manufacturing method, a decrease in ink application amount due to occurrence of a defective nozzle can be supplemented by a method that is simple and suppresses a decrease in manufacturing efficiency.

Further, according to a manufacturing method for manufacturing an organic EL display panel pertaining to another embodiment of the present invention, when applying the ink, a maximum number of ejections of the ink for each use-nozzle for each of the application regions is one. According to this manufacturing method, high manufacturing efficiency and high quality is possible even for a high resolution organic EL display panel.

Further, according to a manufacturing method for manufacturing an organic EL display panel pertaining to another embodiment of the present invention, when forming the application regions, sub-banks are formed in the columns of the first electrodes, partitioning the columns of the first electrodes so that each region surrounded by adjacent ones of the banks and adjacent ones of the sub-banks is an application region, the application regions being aligned along the row direction and along the column direction. According to this manufacturing method, by forming the sub banks, even if ink flows over the bank to an application region adjacent in the row direction during ink application, the ink cannot flow over the sub hank, reducing a range in which color mixing occurs.

Further, according to a manufacturing method for manufacturing an organic EL display panel pertaining to another embodiment of the present invention, when applying the ink, at least one reserve nozzle passes over each of the application regions aligned along the column direction. According to this manufacturing method, reserve nozzles are present for each application region partitioned by the sub banks, and therefore a decrease in ink application amount can be supplemented when a defective nozzle occurs over any of the application regions.

Further, according to a manufacturing method for manufacturing an organic EL display panel pertaining to another embodiment of the present invention, the nozzles are disposed on sub heads, each of the sub heads being elongated in a direction intersecting the row direction, and the sub heads are disposed on a nozzle head that is elongated in the column direction, and are rotatable relative to the nozzle head on a plane parallel to the row direction and the column direction. According to this manufacturing method, an interval (pitch) between nozzles arranged along the column direction can be adjusted when applying ink by rotation of the sub heads relative to the nozzle head.

Further, according to a manufacturing method for manufacturing an organic EL display panel pertaining to another embodiment of the present invention, the method comprises: forming functional layers including functional material in application regions on a substrate by performing ink application, applying ink containing the functional material to the application regions according to an inkjet method performed sequentially on a sequence of substrates, by ejecting the ink from nozzles while the nozzles are scanned above and relative to a top surface of the substrate, the nozzles being arranged in a column direction over the substrate; according to the inkjet method, initial nozzle setting is performed prior to the ink application, and nozzle supplement setting is performed each time the ink application is completed for a certain number of the substrates; the initial nozzle setting inspecting the nozzles and setting a nozzle for which an inspection result falls outside use criteria as a defective nozzle, and setting, among the nozzles, among nozzles that are not selected as a defective nozzle and that do pass over the application regions during the ink application, one or more use-nozzles that eject the ink during the ink application and one or more reserve nozzles that do not eject the ink during the ink application; the nozzle supplement setting inspecting the nozzles and changing a use-nozzle for which an inspection result fails outside use criteria to a defective nozzle, and maintaining a constant number of use-nozzles before and after the nozzle supplement setting by changing a number of reserve nozzles to use-nozzles according to a number of use-nozzles changed to defective nozzles.

According to this method, decrease in ink application amount due to occurrence of a defective nozzle can be supplemented by a method that is simple and suppresses a decrease in manufacturing efficiency.

Further, according to a method for manufacturing an organic EL display panel pertaining to another embodiment of the present invention, in the inspecting of the nozzles in the initial nozzle setting and in the nozzle supplement setting, a planar inspection region is disposed below the nozzles, the nozzles eject the ink to the planar inspection region while the nozzles are scanned relative to the planar inspection region, and an ink state of the ejected ink on the planar inspection region is inspected. According to this method, ejection accuracy of each nozzle can be evaluated from an application state of a plurality of nozzles.

Further, according to a method for manufacturing an organic EL display panel pertaining to another embodiment of the present invention, in the initial nozzle setting, a plurality of the reserve nozzles are set at regular intervals. According to this method, variation in minimum distance from a position of a defective nozzle occurring after initial nozzle setting to a reserve nozzle can be suppressed, and variation in ink application thickness in an application region can be suppressed.

Further, according to a method for manufacturing an organic EL display panel pertaining to another embodiment of the present invention, a plurality of electrodes are arranged in one column in the application regions, and the regular intervals are equal to or less than a distance between centers of adjacent ones of the electrodes. According to this method, at least one reserve nozzle passes over each of the first electrodes. Thus, even if a defective nozzle occurs after initial nozzle setting, a reserve nozzle exists among the nozzles that pass over the same first electrode, and therefore variation in ink application thickness can be further suppressed.

Further, according to a method for manufacturing an organic EL display panel pertaining to another embodiment of the present invention, in the nozzle supplement setting, a reserve nozzle closest to a nozzle changed from a use-nozzle to a defective nozzle is changed to a use-nozzle. According to this method, variation in ink application thickness in an application region can be suppressed.

Further, according to a method for manufacturing an organic EL display panel pertaining to another embodiment of the present invention, in the nozzle supplement setting, a reserve nozzle for which an inspection result falls outside use criteria is changed to a defective nozzle. According to this method, a reserve nozzle for which ink ejection accuracy has decreased since initial nozzle setting is removed as a candidate for a use-nozzle.

Further, according to a method for manufacturing an organic EL display panel pertaining to another embodiment of the present invention, in the nozzle supplement setting a priority order is assigned to reserve nozzles according to inspection results, and among two or more reserve nozzles close to a nozzle changed from a use-nozzle to a defective nozzle a reserve nozzle with a highest priority is changed to a use-nozzle. According to this method, in ink application after nozzle supplement setting, a nozzle with a higher ejection accuracy can be used, suppressing occurrence of defective ink application and application unevenness.

Further, according to a method for manufacturing an organic EL display panel pertaining to another embodiment of the present invention, in the nozzle supplement setting, a defective nozzle for which an inspection result falls within use criteria is changed to a reserve nozzle. According to this method, a number of reserve nozzles is increased, which can extend a period until reserve nozzles become insufficient.

Further according to a method for manufacturing an organic EL display panel pertaining to another embodiment of the present invention, in a case of insufficient numbers of reserve nozzles in the nozzle supplement setting, maintenance is performed on the nozzles, and after the maintenance, the initial nozzle setting is performed. According to this method, ejection accuracy of defective nozzles can be increased, and when reserve nozzles can be secured, ink application can restart.

In the present application, the terms "above" and the like do not refer to upwards (vertically upwards) in absolute space, but define position relative to a layered structure of the organic EL display panel, based on layer order. More specifically, in the organic EL display panel, a direction perpendicular to a main surface of a substrate and from the substrate towards layers thereon is defined as an upward direction.

Further, for example, when a term such as "on a substrate" is used, it is assumed to indicate not only a region directly above the substrate, but also to include a region above the substrate with a layer therebetween.

Embodiment

The following describes a method for manufacturing an organic EL display panel pertaining to one aspect of the present invention, with reference to the drawings. Note that the drawings are schematic, and dimensions, vertical to horizontal ratios, etc., may differ from actual implementation. Further, in the present application, plan view diagrams and plan view photographs are diagrams and photographs of objects viewed from vertically above, and in the case of the organic EL display panel, the diagrams and photographs are from a view vertically above a substrate top surface. Further, a planar shape refers to a shape appearing in a plan view diagram or plan view photograph.

1. Overall Configuration of Organic EL Display Device 1

Figure 1:
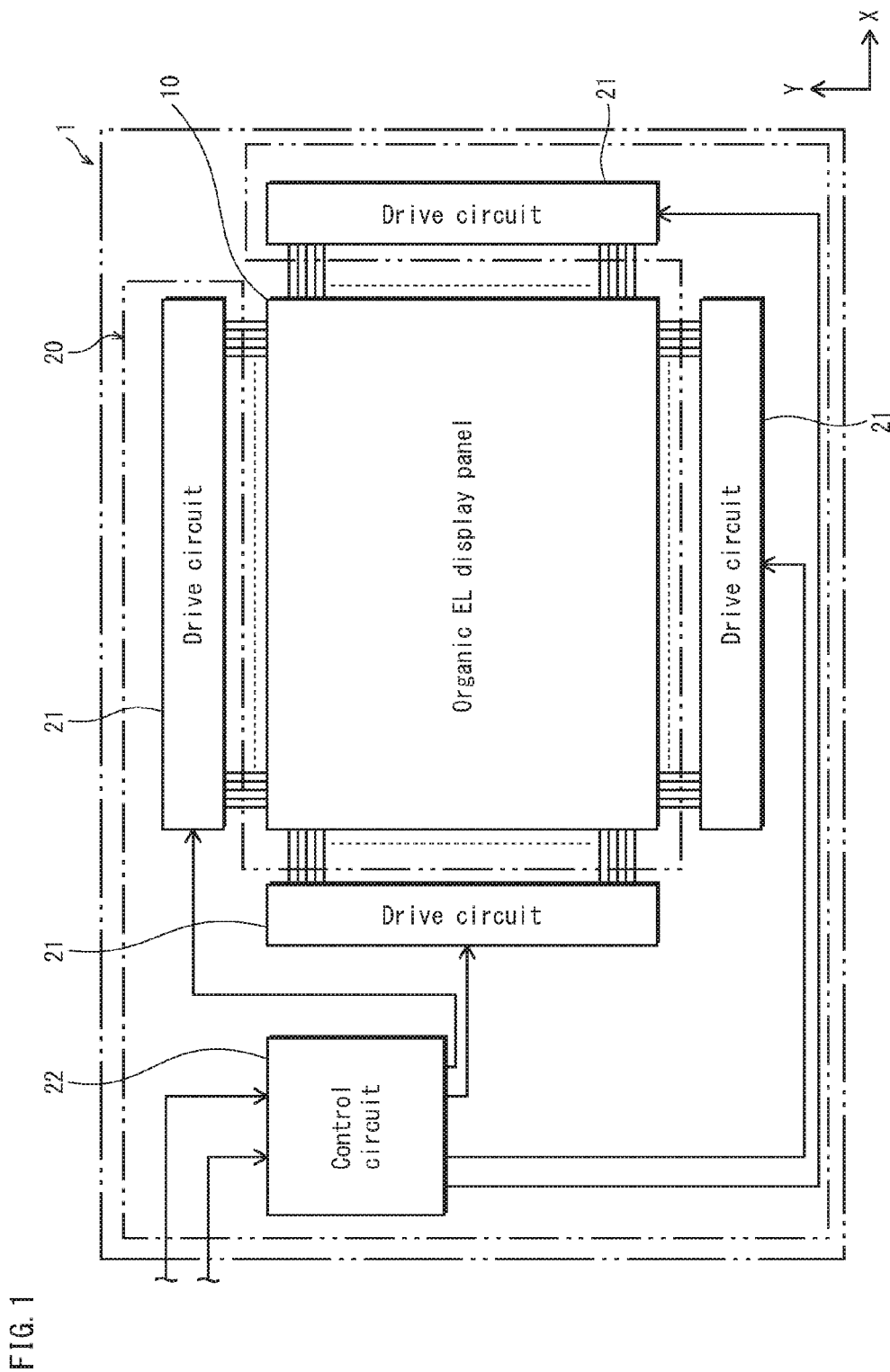
FIG. 1 is a block diagram showing an overall configuration of an organic EL display device 1.

FIG. 1 is a block diagram showing an overall configuration of an organic EL display device 1. The organic EL display device 1 is a display device used, for example, in televisions, personal computers, portable terminals, and commercial displays (electronic billboards, large screens for commercial facilities). The organic EL display device 1 includes an organic EL display panel 10 and a drive/control 20 electrically connected thereto.

The organic EL display panel 10 (hereinafter, "panel 10") is a top-emission display panel, which is an image display surface having a rectangular top surface, for example. As shown in FIG. 1, for the purpose of following description, a direction along a long edge of the top surface of the panel 10 is an X direction and a direction along a short edge of the top surface of the panel 10 is a Y direction. In the panel 10, organic EL elements (not illustrated) are arranged along the image display surface, light emitted from the organic EL elements combining to display an image. The panel 10, as an example, uses an active matrix.

The display/control 20 includes drive circuits 21 connected to the panel 10 and a control circuit 22 connected to an external device such as a computer or a reception/transmission device such as an antenna. The drive circuits 21 include a power supply circuit for supplying electric power to organic EL elements, a signal circuit for applying a voltage signal to control electric power supplied to the organic EL elements, and a scanning circuit for switching a position to which a voltage signal is applied at regular intervals. The control circuit controls operation of the drive circuits 21 in accordance with data that includes image information, inputted from the external device or reception/transmission device.

In FIG. 1, as one example, four of the drive circuits 21 are arranged around the panel 10, but the drive/control 20 is not limited to this configuration, and number and position of the drive circuits 21 can be changed as appropriate.

2. Panel 10

(1) Plane Configuration

Figure 2:
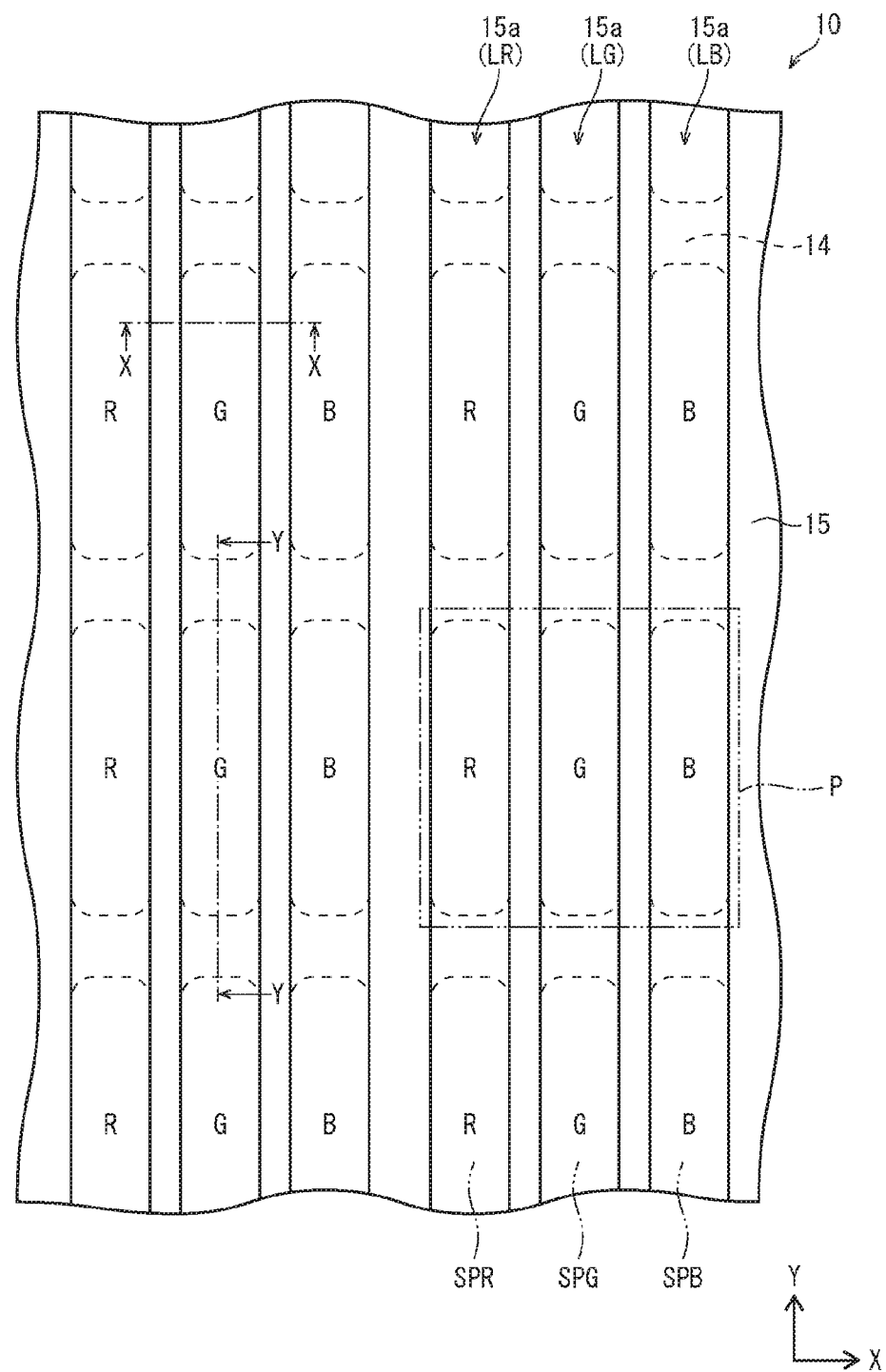
FIG. 2 is a schematic plan view of an enlargement of a portion of an image display surface of an organic EL display panel 10.

FIG. 2 is a schematic plan view of an enlargement of a portion of the image display surface of the organic EL display panel 10. In the panel 10, as an example, sub pixels SPR, SPG, SPG for emitting red, green, and blue light, respectively, are arranged in a row and column matrix. The sub pixels SPR, SPG, SPB alternate in the X direction along the long edge of the panel 10, and a set of one each of the sub pixels SPR, SPG, SPB make up one pixel P. In a pixel P it is possible to express a full range of color by combining gradation controlled luminance of emitted light of the sub pixels SPR, SPG, SPB.

Further, in the Y direction along the short edge of the panel 10, each column including only one of the sub pixels SPR, the sub pixels SPG, or the sub pixels SPB makes up a sub pixel column LR, a sub pixel column LG, or a sub pixel column LB, respectively. Thus, across the panel 10, the pixels P are arranged in a row and column matrix along the X direction and the Y direction, and an image is displayed on the image display surface by combining emitted colors of the pixels P.

Organic EL elements for emitting red, green, and blue light are formed in the sub pixels SPR, SPG, SPB, respectively, and the sub pixels SPR, SPG, SPB emit light by extraction from the image display surface of light emitted from the organic EL elements. Light emission colors of the sub pixels SPR, SPG, SPB may be the light emission colors of the organic EL elements, and may be corrected by a color filter from the light emission colors of the organic EL elements.

In the panel 10, as an example, a line bank system is adopted. That is, by forming banks 15 that separate individual columns of the sub pixel columns LR, LG, LB, application regions 15*a* are formed along the X direction as regions between adjacent ones of the banks 15. The application regions 15*a* are regions to which ink is applied when a functional layer is formed by an inkjet method, described later. According to a line bank system, the application regions 15*a* are continuous along the sub pixel columns LR, LG, LB, and therefore applied ink can flow along the Y direction, decreasing film thickness unevenness of functional layers.

In the panel 10, in the application regions 15*a*, insulating layers (pixel restriction layers) 14 are formed that insulate the sub pixels SPR, SPG, SPB, making it possible for each of the sub pixels SPR, SPG, SPB to emit light independently. In FIG. 2, the pixel restriction layer 14 is represented by a dashed line, which indicates the pixel restriction layer 14 is covered by a functional layer and not directly visible in plan view.

(2) Cross Section Configuration

Figure 3A:
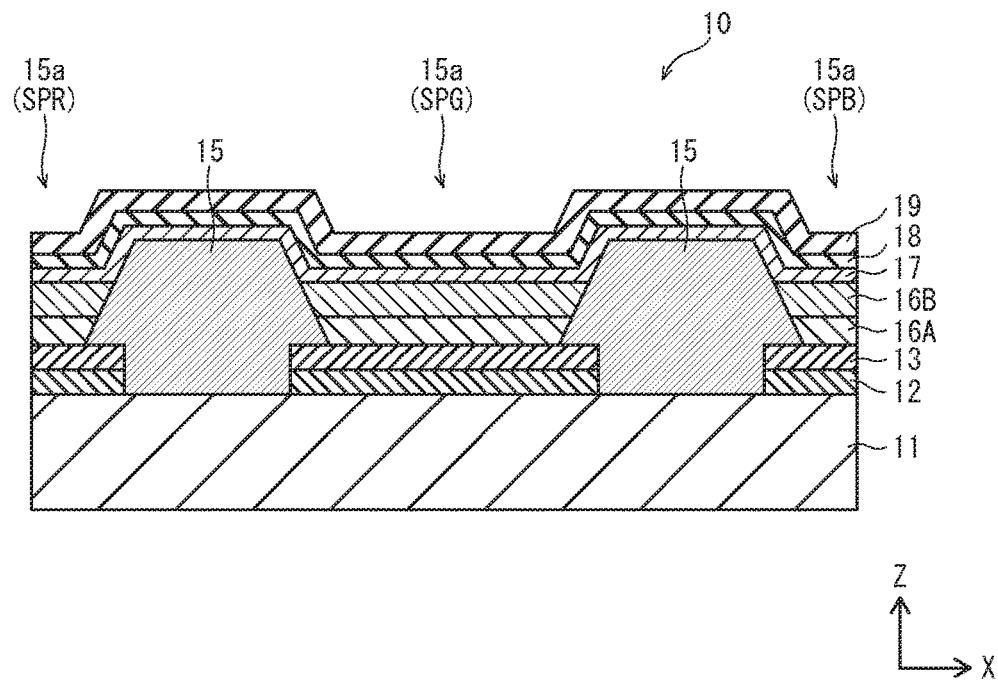
FIG. 3A is a schematic cross section along an X-X line in FIG. 2.
Figure 3B:
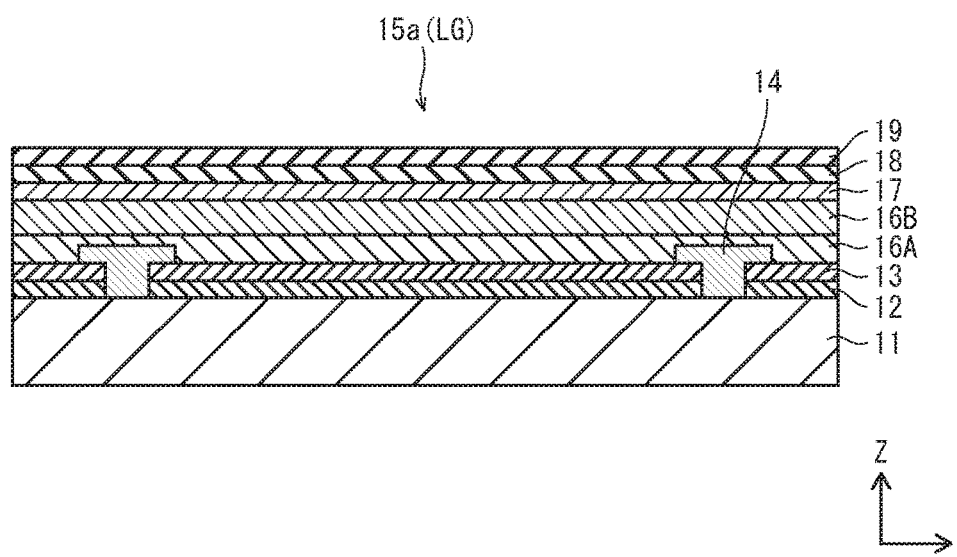
FIG. 3B is a schematic cross section along a Y-Y line in FIG. 2.

FIG. 3A is a schematic cross section along an X-X line in FIG. 2. FIG. 3B is a schematic cross section along a Y-Y line in FIG. 2. FIG. 3A is centered on a cross section of the sub pixel SPG and FIG. 3B shows only a cross section of the sub pixel column LG, but the sub pixels SPR, SPB and the sub pixel columns LR, LB are also configured as shown in FIG. 3A and FIG. 3B. Further, in FIG. 3A and FIG. 3B, a direction towards the top of the diagram is a Z direction.

The panel 10 includes a substrate 11, first electrodes 12, hole injection layers 13, pixel restriction layers 14, banks 15, hole transport layers 16A, organic light-emitting layers 16B, an electron transport layer 17, a second electrode 18, and a thin film sealing layer 19. Of these, the hole transport layers 16A and the organic light-emitting layers 16B are formed by an inkjet method described later. Note that this layer structures is just an example, and layers such as an electron injection layer, a blocking layer, and a buffer layer may be added, and a portion of the layers above may be omitted. Further, as in an electron injection transport layer, one physical layer may have multiple functions.

a. Substrate 11

The substrate 11 is a support member of the panel 10. Although not illustrated, a thin film transistor (TFT) layer is formed on a rectangular plate-shaped substrate body of the substrate 11.

The substrate body is formed from an electrically insulating material or a metal material such as aluminium or stainless steel that is coated with an electrically insulating material. The electrically insulating material may be a glass material such as non-alkaline glass, soda glass, non-fluorescent glass, phosphate glass, borate glass, or silica glass. Further, the electrically insulating material may be a resin material such as acrylic resin, styrene resin, polycarbonate resin, epoxy resin, polyethylene resin, polyester resin, polyimide resin, or silicone resin. Further, the electrically insulating material may be a metal oxide material such as aluminium oxide.

Organic EL elements may deteriorate due to reactions with moisture, oxygen, or the like, and therefore the substrate body preferably suppresses penetration of moisture or oxygen into a lower portion of the organic EL elements by use of a material having low moisture permeability, such as glass or metal. Further, when a resin material is used for the substrate body, a top surface of the resin material is preferably coated with a thin film having a low moisture permeability, such as silicon nitride, silicon oxynitride, or aluminium oxide.

The TFT layer is an electric circuit layer formed on the substrate body, in which are arranged control circuits for supplying electrical power, for example a power supply circuit to supply power to an organic EL element. More specifically, the TFT layer is a layered body including a semiconductor layer, a conductive layer, and an electrically insulating layer disposed on the substrate body, the layered body forming electric circuit elements such as a TFT element, a capacitor element, and wiring. Further, an interlayer insulating layer (not illustrated) is formed in a top portion of the TFT layer, planarizing a top surface of the substrate 11.

The semiconductor layer may be formed from a general semiconductor material such as silicon, an oxide semiconductor material such as indium-zinc-gallium oxide, an organic semiconductor material having a π electron conjugated system spread in a planar direction such as a polycyclic aromatic compound, or the like. The conductive layer may be formed from a metal material such as aluminium (Al), copper (Cu), or gold (Au), a carbon material such as graphite or carbon nanotube, a conductive oxide material such as indium tin oxide (ITO) or indium zinc oxide (IZO), or the like. The electrically insulating layer may be formed from an inorganic material such as silicon nitride, silicon oxide, silicon oxynitride, or aluminium oxide, an organic material such as acrylic resin, polyimide resin, silicone resin, or phenol resin, or the like. The interlayer insulating layer is formed from an electrically insulating material that can be patterned, for example an organic material such as acrylic resin, polyimide resin, silicone resin, or phenol resin.

Note that as a passivation layer other than the interlayer insulating layer, a layer of a material such as silicon nitride or aluminium oxide covering all electric circuit elements of the TFT layer may be formed in the TFT layer.

b. First Electrodes 12

The first electrodes 12 are electrodes arranged in a row and column matrix in which row direction and column direction are defined as the X direction and the Y direction, respectively, and have a role of anodes supplying holes to the organic light-emitting layers 16B. Each of the first electrodes 12 defines a position of an organic EL element, and is formed to correspond to a location of a sub pixel SPR, SPG, SPB.

The first electrodes 12 may be formed from a metal material such as Al, silver (Ag), molybdenum (Mo), tungsten (W), titanium (Ti), chromium (Cr), nickel (Ni), or zinc (Zn). Further, the first electrodes 12 may be formed from an alloy material combining such metal materials, or multilayer structures in which a metal material and an alloy material are layered. Further, for purposes of improving bonding between the first electrodes 12 and the hole injection layers 13, and preventing oxidization of the first electrodes 12, a layer made from a light-transmissive electrically conductive oxide material such as ITO, IZO, or the like may be layered to form a multilayer structure on a layer of the first electrodes 12. Further, for purposes of suppressing erosion by wet etching, diffusion of hydrogen to a lower layer, etc., a barrier metal layer may be formed from a metal oxide such as tungsten oxide as a bottom layer of the first electrodes.

Note that in terms of supplying holes, it is preferable to use a material having a high work function for the first electrodes 12. Further, in the case of the panel 10 being a top-emission type, the first electrodes 12 are preferably light-reflective.

c. Hole Injection Layers 13

The hole injection layers 13 are a type of functional layer, are formed on the first electrodes 12, and have a role of reducing an energy barrier to supplying (injecting) holes into the organic light-emitting layers 16B from the first electrodes 12, thereby facilitating hole injection. In the panel 10, the hole injection layers 13 are formed one-to-one with the first electrodes 12, and are disposed in a row and column matrix on the substrate 11. The hole injection layers 13 are formed using a material having appropriate ionization energy as a functional material. For example, a metal oxide material such as an oxide of Ag, Mo, Cr, W, Ni, vanadium (V), iridium (Ir), or the like, poly(3,4-ethylenedioxythiophene) polystyrene sulfonate (PEDOT:PSS), or the like.

d. Pixel Restriction Layers 14

The pixel restriction layers 14, as shown in FIG. 3B, are electrically insulating layers formed to cover edges of the first electrodes 12 and the hole injection layers 13, and are formed to be lower than the banks 15 in terms of height (distance along the Z direction) from the top surface of the substrate 11. The pixel restriction layers 14 have a role of improving electrical insulation between adjacent ones of the sub pixels SPR, SPG, SPB (first electrodes 12) in the application regions 15a. Further, the pixel restriction layers 14 suppress, by covering ends of the first electrodes 12, shorts due to contact between the first electrodes 12 and the second electrode 18.

Note that in the panel 10, as shown in FIG. 2, the planar shape of the pixel restriction layers 14 covering the ends of the first electrodes 12 and the hole injection layers 13 is curved. By forming the pixel restriction layers 14 in this way, when the hole transport layers 16A are formed, ink easily spreads to edges of regions surrounded by the hole injection layers 13, the pixel restriction layers 14, and the banks 15, suppressing wetting failure.

The pixel restriction layers 14 may be formed from an inorganic material such as silicon nitride, silicon oxide, silicon oxynitride, or aluminium oxide, an organic material such as acrylic resin, polyimide resin, or novalac-type phenolic resin, or the like. Further, surfaces of the pixel restriction layers 14 are preferably lyophilic with respect to ink used when forming the hole transport layers 16A, such that functional material contained in the ink spreads easily in the application regions 15a.

e. Banks 15

The banks 15 partition columns of the first electrodes 12 and the hole injection layers 13, each column being aligned along the Y direction, thereby forming the application regions 15a, which are regions between adjacent ones of the banks 15, aligned along the X direction. Here, the banks 15 are linear, each extending in the Y direction as shown in FIG. 2, forming so-called line banks.

Specifically, when forming the hole transport layers 16A and the organic light-emitting layers 16B, the banks 15 suppress flow of ink containing functional material out of the application regions 15a. Further, the banks 15 have a role of defining and electrically insulating the hole transport layers 16A and the organic light-emitting layers 16B after these layers are formed.

The banks 15 are formed from, for example, a photosensitive resist material that is electrically insulating and patternable by a photolithography method. Examples of a photosensitive resist material include acrylic resin, polyimide resin, and novalac-type phenolic resin. The banks 15 may contain material other than photosensitive resist material. Further, photosensitivity of the photosensitive resist material may be a negative type in which solubility in a developer is reduced by light exposure or a positive type in which solubility in a developer is increased by light exposure, but a negative type is preferable. Typically, when exposed from above, a photosensitive region of a photosensitive resist material tends to become an inverted tapered shape with a wide upper portion and a narrow lower portion. Accordingly, for a negative type in which a photosensitive region remains, photosensitive resist material after developing has a shape close to an inverted taper, and can suppress flow of ink over the banks 15.

Note that the banks 15 preferably have resistance to organic solvents and heat from the method for manufacturing the panel 10, described later. Further, in order to suppress ink flow, surfaces of the banks 15 preferably have liquid repellency. For example, by using a material containing a liquid repellent component for the banks 15, or by surface treating the banks 15 to impart liquid repellency. As a liquid repelling component, a fluorine compound or siloxane compound may be used. Such a liquid repellant component may be mixed into a photosensitive resist material 15P as an independent material, for example, or may be contained in a copolymer of the photosensitive resist material 15P, for example. Further, as a surface treatment to impart liquid repellency, plasma treatment under a fluorine gas atmosphere may be used, for example.

f. Hole Transport Layers 16A

The hole transport layers 16A are a type of functional layer, are formed by drying ink applied to the application regions 15a according to an inkjet method described later, and have a role of improving transportability of holes supplied from the first electrodes 12 to the organic light-emitting layers 16B. In the panel 10 for which a line bank system is adopted, the hole transport layers 16A extend in the Y direction along the application regions 15a, and within each of the application regions 15a the hole transport layers 16A are continuous across the first electrodes 12, the hole injection layers 13, and the pixel restriction layers 14. That is, in each of the pixel columns LR, LG, LB, the sub pixels SPR, SPG, SPB therein share a common one of the hole transport layers 16A.

The hole transport layers 16A are formed by using an organic material that has a relatively high hole mobility. Such materials include, for example, triazole derivatives, oxydiazole derivatives, imidazole derivatives, polyarylalkane derivatives, pyrazoline derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, porphyrin compounds, aromatic tertiary amine compounds, styrylamine compounds, butadiene compounds, polystyrene derivatives, triphenylmethane derivatives, tetraphenyl benzene derivatives (all disclosed in JP H5-163488), and the like.

g. Organic Light-Emitting Layers 16B

The organic light-emitting layers 16B are a type of functional layer and are formed by drying ink applied to the application regions 15a by an inkjet method described later, similar to that of the hole transport layers 16A. In the organic light-emitting layers 16B, light emission (electroluminescence) occurs due to recombination of hole and electrons supplied from the first electrodes 12 and the second electrode 18.

In the panel 10 for which a line bank system is adopted, the organic light-emitting layers 16B extend in the Y direction along the application regions 15a, similarly to the hole transport layers 16A, and completely cover the hole transport layers 16A in the application regions 15a. That is, in each of the pixel columns LR, LG, LB, the sub pixels SPR, SPG, SPB therein share a common one of the organic light-emitting layers 16B. However, only portions of the organic light-emitting layers 16B over the first electrodes 12 emit light, independently emitting light for each of the sub pixels SPR, SPG, SPB.

As a functional material, the organic light-emitting layers 16B are formed by using an organic light-emitting material that emits light due to electroluminescence. Examples of organic light-emitting materials include known fluorescent and phosphorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylene pyran compounds, dicyanomethylene thiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of a Schiff salt and a group III metal, oxine metal complexes, fluorescent substances such as rare earth complexes (all described in JP H5-163488), and the like. Further, for example, a mixed layer of an organic compound doped with a fluorescent substance or phosphorescent substance described above may be used. Note that in the panel 10, a three-color application method is adopted in which the organic light-emitting layers 16B include organic light-emitting materials that emit red, green, and blue light in the sub pixel columns LR, LG, LB, respectively, supporting full color display.

h. Electron Transport Layer 17

The electron transport layer 17 is a type of functional layer, formed to cover all of the substrate 11 on which the banks 15 and the organic light-emitting layers 16B are formed, and has a role of improving transportability of electrons supplied from the second electrode 18 to the organic light-emitting layers 16B.

The electron transport layer 17 is formed by using an organic material that has a relatively high electron mobility. Such materials include, for example, nitro-substituted fluorenone derivatives, thiopyran dioxide derivatives, diphenoquinone derivatives, perylene tetracarboxylic derivatives, anthraquinodimethane derivatives, fluorenylidene methane derivatives, anthrone derivatives, oxadiazole derivatives, perinone derivatives, quinoline complex derivatives (all described in JP H5-163488), phosphorus oxide derivatives, triazole derivatives, triazine derivatives, silole derivatives, dimesitylboron derivatives, triarylboron derivatives, and the like.

i. Second Electrode 18

The second electrode 18 is an electrode covering a functional layer and, in the panel 10, is formed over the entirety of the substrate 11 to cover the electron transport layer 17. The second electrode 18 has a role of a cathode supplying electrons to the organic light-emitting layers 16B.

The second electrode 18 is formed from a light transmissive electrically conductive material such as ITO or IZO, or a layer made from a light transmissive electrically conductive material, onto which a layer of a metal material such as Ag, Au, Ni, Cu, Al, platinum (Pt), or palladium (Pd), or an alloy of same, is layered.

Note that in terms of supplying electrons, it is preferable to use a material having a low work function for the second electrode 18. Further, in the panel 10, which is a top emission type, it is preferable to use a material that has a high light transmittance of 80% or more for the second electrode 18.

j. Thin Film Sealing Layer 19

The thin film sealing layer 19 is a layer formed to cover the substrate 11 on which the elements from the first electrodes 12 to the second electrode 18 are formed, and has a role of suppressing exposure of the elements to moisture, oxygen, and the like. The thin film sealing layer 19 is formed from a material that has a low moisture permeability, for example an inorganic material such as silicon nitride, silicon oxynitride, carbon oxide, carbon nitride, aluminium oxide, or the like. Further, in the panel 10, which is a top emission type, it is preferable to use a material that has a high light transmittance and a small difference in refractive index with the second electrode 19 in the thin film sealing layer 19.

k. Other

In the panel 10, a sealing plate formed from a material that has a low moisture permeability such as glass may be disposed on the substrate 11 on which the above elements are formed. At such a time, the substrate 11 and the sealing plate are bonded to each other by, for example, an adhesive layer made from a curable resin material. Thus, penetration of moisture, oxygen, etc., to the organic EL elements on the substrate 11 can be further suppressed.

Further, a color filter may be disposed on the sealing plate in positions corresponding to the sub pixels SPR, SPG, SPB. Thus, light emission colors of the sub pixels SPR, SPG, SPB can be corrected. Further, a black matrix may be disposed on the sealing plate in positions corresponding to between the sub pixels SPR, SPG, SPB, and a periphery region of the sealing plate. Thus, reflection of external light on the image display surface of the panel 10 can be suppressed, and contrast in the image display surface can be improved between the pixels P and other portions.

Note that the above is just one example of a cross section configuration. As another example, the electron transport layer 17 and the second electrode 18 as shown in FIG. 3A are formed across a plurality of the application regions 15a, but may be formed across all or part of the application regions 15a, or formed for each of the sub pixels SPR, SPG, SPB. Further, for example, in FIG. 3A and FIG. 3B, the hole injection layers 13 are formed for each of the sub pixels SPR, SPG, SPB, but may be formed for each of the application regions 15a, or for a plurality of the application regions 15a.

3. Method for Manufacturing Panel 10

(1) Overall Process

Figure 4A:
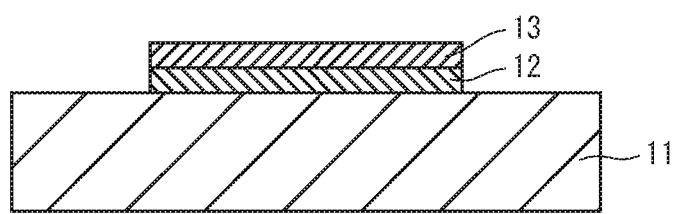
FIG. 4A, FIG. 4B, and FIG. 4C are schematic cross sections showing manufacturing processes for the organic EL display panel 10.
Figure 4B:
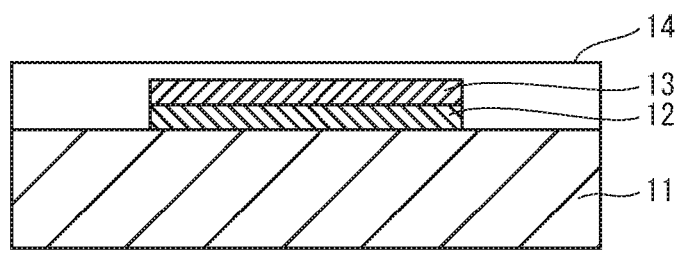
Figure 4C:
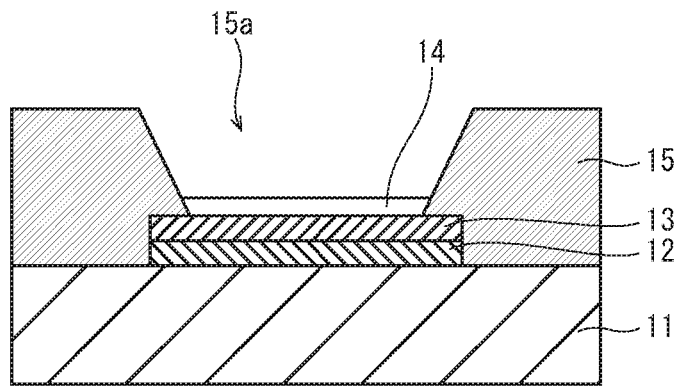

An overall process of the method for manufacturing the panel 10, which is one aspect of the present invention, is first described below. FIG. 4A to FIG. 6C are schematic cross sections showing processes in manufacturing the panel 10. Note that the cross section shown in FIG. 4A to FIG. 6C corresponds to the cross section of the sub pixel SPG in FIG. 3A. Further, the pixel restriction layer 14 shown without hatching in FIG. 4B and FIG. 4C is not present in the cross section, but indicates a surface of the pixel restriction layer 14 present further "behind" the cross section.

a. Substrate Preparation

First, the substrate 11 is prepared. More specifically, a substrate main body is prepared from an electrically insulating material in a planar shape, and a TFT layer is formed on the substrate main body. Forming the TFT layer can be performed as follows.

First, a semiconductor material layer, a conductive material layer, or an electrically insulating material layer, patterned in a predefined shape is formed on the substrate main body, and this is repeated to form a predefined electric circuit. Depending on the material of a layer, the layer may be formed by using a dry process such as vacuum deposition, electron beam evaporation, ion plating, air layer growth, or the like, or by using a wet process such as printing, spin coating, inkjet, dispensing, die coating, or the like. Patterning of each layer may be performed by photolithography, shadow masking, metal masking, or the like, or by directly formed predefined shapes in the case of a wet process. Further, each layer may be treated as required by using plasma injection, ion injection, baking, or the like.

Subsequently, a passivation layer and an interlayer insulating layer are formed in this order so as to over the electric circuits. In forming the passivation layer and the interlayer insulating layer, a dry process or a wet process can be used, depending on material of the layer. Note that openings (contact holes) are formed in the passivation layer and the interlayer insulating layer at predefined positions, so as to electrically connect TFT elements in the electric circuits to the first electrodes 12. Patterning as described above can be used in forming the contact holes.

b. Forming First Electrodes and Hole Injection Layers

Subsequently, the first electrodes 12 and the hole injection layers 13 are formed on the substrate 11, in a row column matrix in which the row direction and the column direction are defined as the X direction and the Y direction, respectively. For example, after a metal thin film is formed on the substrate 11 by sputtering, a metal oxide thin film is formed on the metal thin film by reactive sputtering. Subsequently, after application of a photoresist material on the metal oxide thin film, the photoresist material is patterned by photolithography, leaving the photoresist material only in regions in which sub pixels SPR, SPG, SPB are to be formed, in a row column matrix in the X direction and the Y direction. Subsequently, dry etching and wet etching are performed in this order to etch the metal oxide thin film and the metal thin film in locations where the photoresist material is not disposed. Finally, the photoresist material on the metal oxide thin film and residue is cleaned away. This makes it possible to form the first electrodes 12 from the metal thin film, arranged in a row column matrix along the X direction and the Y direction, and to form the hole injection layers 13 from the metal oxide thin film, layered on the metal thin film (FIG. 4A). In this way, by etching the first electrodes 12 and the hole injection layers 13 at the same time, manufacturing processes can be made more efficient. Further, by patterning using the same photoresist, alignment accuracy between the first electrodes 12 and the hole injection layers 13 is improved.

Note that methods of forming the first electrodes 12 and the hole injection layers 13 are not limited to a combination of sputtering, reactive sputtering, and photolithography, and, depending on materials, wet processes, dry processes, and patterning given as examples above can be used. Further, in a case of a barrier metal being disposed as a lowest layer of the first electrodes 12, it suffices that a metal oxide thin film is formed before a metal thin film is formed, and dry etching of the metal oxide thin film is performed after wet etching of the metal thin film. Note that in the method for manufacturing the panel 10, etching of the first electrodes 12 and the hole injection layers 13 need not be connected as described above, and formation and patterning of a metal oxide thin film to form the hole injection layers 13 may be performed after forming the first electrodes 12.

c. Forming Pixel Restriction Layers

Next, the pixel restriction layers 14 are formed on the substrate 11 on which the first electrodes 12 and the hole injection layers 13 are formed. More specifically, for example, an inorganic material thin film is formed by using vacuum deposition to cover the substrate 11, and shaped using photolithography to cover ends of the first electrodes 12 and the hole injection layers 13 in curved planar shapes that extend in the X direction, as shown in FIG. 2. Thus, the pixel restriction layers 14 are formed (FIG. 4B). Note that the pixel restriction layers 14 may be formed by using an organic material, and may be formed by using any dry process, wet process, or patterning given as an example above.

d. Bank Formation

Next, the banks 15 are formed on the substrate 11, partitioning the first electrodes 12 and the hole injection layers 13 into single columns that extend the Y direction. Thus, the application regions 15a are formed as regions between adjacent ones of the banks 15, and are arranged along the X direction. That is, according to the present embodiment, the X direction corresponds to the row direction and the Y direction corresponds to the column direction. More specifically, a photosensitive resist material is applied by using die coating, for example, to have a greater film thickness than the pixel restriction layers 14 across the entirety of the substrate 11, then patterned by using photolithography into shapes that extend in the Y direction, thereby forming the banks 15 that partition the first electrodes 12 and the hole injection layers 13 into single columns that extend in the Y direction (FIG. 4C). Note that the banks 15 can be formed by using another wet process, dry process, or patterning method.

e. Ink Application

Figure 5A:
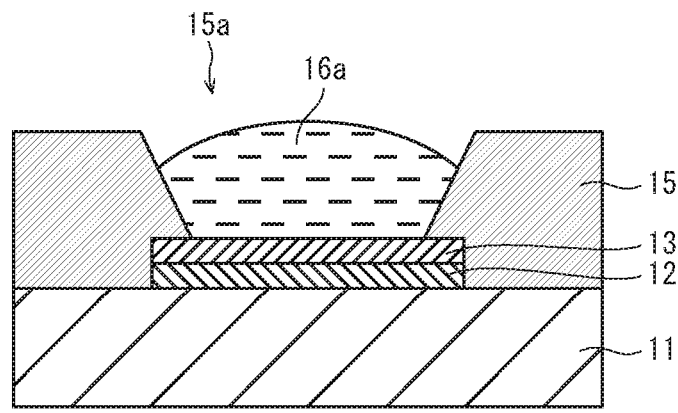
FIG. 5A, FIG. 5B, and FIG. 5C are schematic cross sections showing manufacturing processes for the organic EL display panel 10.

Next, according to an inkjet method described later, ink 16a containing a functional material, here material of the hole transport layers 16A, is ejected to apply the ink 16a into the application regions 15a (FIG. 5A). Note that the ink 16a is ejected into the application regions 15a so as to be continuous across the pixel restriction layers 14. Thus, the ink 16a can flow in the Y direction within the application regions 15a, decreasing application unevenness of the ink 16a in the application regions 15a. That is, in subsequent drying, occurrence of film thickness unevenness and malformation of the hole transport layers 16A is reduced in the application regions 15a.

f. Drying

Figure 5B:
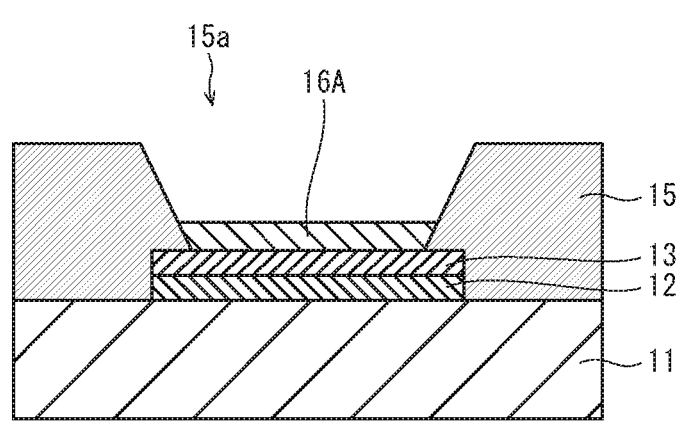

Next, the hole transport layers 16A, which are functional layers including functional material, are formed in the application regions 15a by drying the ink 16a that is applied. More specifically, for example, solvent of the ink 16a is evaporated by placing the substrate 11 after application of the ink 16a in a vacuum environment such as a vacuum chamber. Thus, the hole transport layers 16A can be formed in the application regions 15a (FIG. 5B).

g. Forming Organic Light-Emitting Layers

Figure 5C:
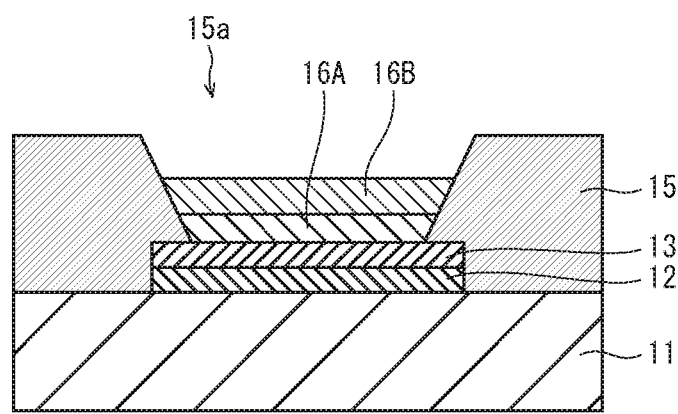

Next, similar to the method for forming the hole transport layers 16A, according to an inkjet method described later, ink containing a functional material, here organic light-emitting material, is ejected to apply the ink to the application regions 15a. Subsequently, by drying the applied ink, functional layers including organic light-emitting material, i.e., the organic light-emitting layers 16B, are formed in the application regions 15a (FIG. 5C). Note that when applying ink, the ink is applied to entire surfaces of the hole transport layers 16A in the application regions 15a, and the ink can flow in the application regions 15a in the Y direction of FIG. 2. Thus, application unevenness of ink in the application regions 15a is decreased, and in drying, occurrence of film thickness unevenness and malformation of the organic light-emitting layers 16B is decreased.

h. Forming Electron Transport Layer

Figure 6A:
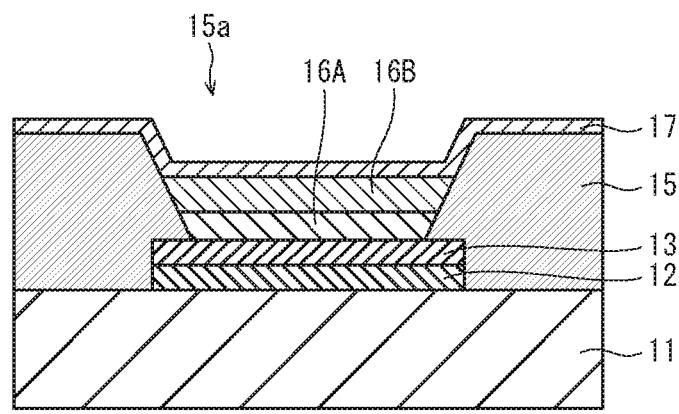
FIG. 6A, FIG. 6B, and FIG. 6C are schematic cross sections showing manufacturing processes for the organic EL display panel 10.

Next, the electron transport layer 17 is formed so as to cover all of the banks 15 and the organic light-emitting layers 16B on the substrate 11 (FIG. 6A). In forming the electron transport layer 17, depending on material of the electron transport layer 17, a dry process or a wet process given as an example above can be used.

i. Forming Second Electrode

Figure 6B:
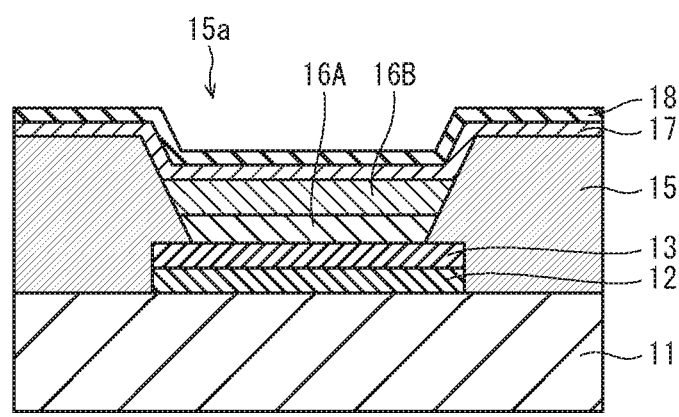

Next, the second electrode 18 is formed covering a functional layer, here the electron transport layer 17 (FIG. 6B). For example, by a dry process given as an example above, a light transmissive electrically conductive oxide material thin film is formed on the electron transport layer 17 to form the second electrode 18.

j. Sealing

Figure 6C:
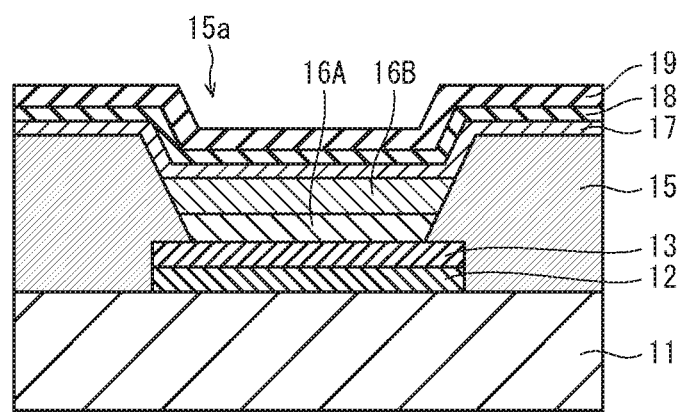

Next, the substrate on which the first electrodes 12 to the second electrode 18 are formed is sealed. More specifically, for example, an inorganic material thin film is formed by a dry process given as an example above, so as to cover a top surface of the substrate 11 on which the second electrode 18 is formed, to form the thin film sealing layer 19 (FIG. 6C).

The panel that has a cross section structure as shown in FIG. 2 is completed by the above method.

(2) Ink Application According to Inkjet Method

The following describes ink application according to the inkjet method used in forming the hole transport layers 16A and the organic light-emitting layers 16B.

a. Configuration of Inkjet Device 100

Figure 7:
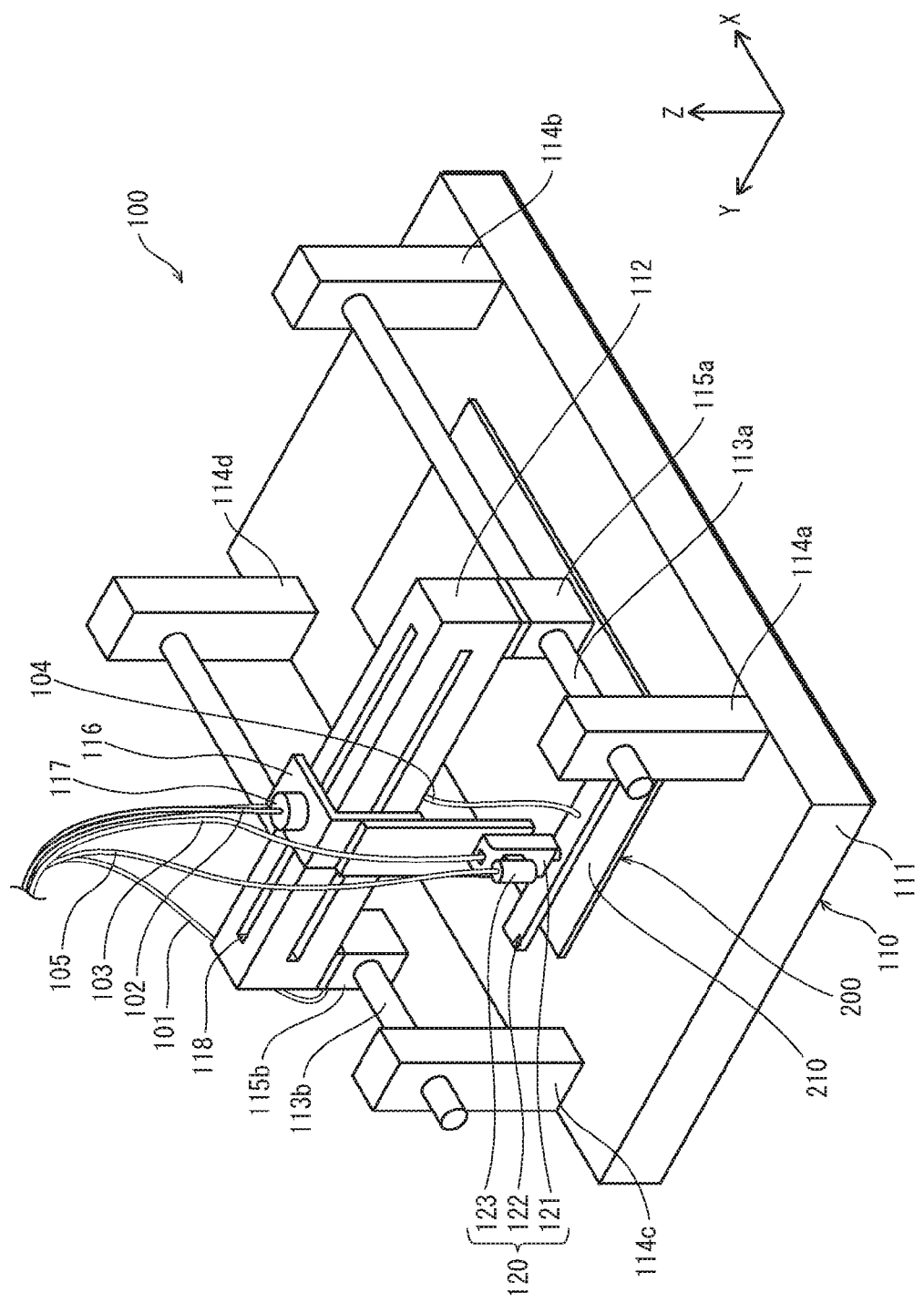
FIG. 7 is a schematic perspective view showing an inkjet device 100.

First, the inkjet device 100 used in ink application according to the inkjet method is described. FIG. 7 is a schematic perspective view showing the inkjet device 100. The inkjet device 100 includes a work table 110 and a head unit 120 as main components.

(a) Work Table 110

The work table 110 is a gantry system work table, and includes a base 111 on which a substrate 200 is mounted, the substrate 200 being a target for ink application, and a mobile cradle 112 that is elongated and disposed above the base 111. Note that the substrate 200 is, for example, the substrate 11 in the manufacturing process (prior to ink application) of the panel 10, and an inspection substrate used in nozzle inspection, to be described later. Further, for example, the substrate 200 may be an aggregate of a plurality of the substrate 11 after division. In this case, each of the application regions 15a formed on a substrate upper surface 210 is formed extending along the Y direction, which is a short side direction of the substrate upper surface 210.

The base 111 is plate-shaped, and a top surface thereof on which the substrate 200 is mounted is rectangular. Here, a direction along a long edge of the top surface of the base 111 is a longitudinal direction of the base 111 and a direction along a short edge of the top surface of the base 111 is a short direction of the base 111.

The mobile cradle 112 is suspended between a pair of guide shafts 113a, 113b that are disposed in parallel along the longitudinal direction of the base 111, and a longitudinal direction of the mobile cradle 112 is disposed along the short direction of the base 111. The pair of the guide shafts 113a, 113b are supported by pillar stands 114a, 114b, 114c, 114d disposed at corners of the main surface of the base 111.

The mobile cradle 112 is attached to the guide shafts 113a, 113b via linear motor units 115a, 115b that are fixed to longitudinal direction ends of the mobile cradle 112.

Accordingly, the mobile cradle 112 is mobile along the longitudinal direction of the base 111 according to drive of the linear motor units 115*a*, 115*b*.

Further, an L-shaped pedestal 116 is attached via a servomotor unit 117 to a guide groove 118 that extends in the longitudinal direction along a surface of the mobile cradle 112. Accordingly, the pedestal 116 is mobile along the short direction of the base 111 according to drive of the servomotor unit 117.

Note that the linear motor units 115*a*, 115*b*, and the servomotor unit 117 are driven by a control device (not illustrated) connected via communication cables 101, 102.

(b) Head Unit 120

The head unit 120 includes a main body 121, a nozzle head 122, and an image capture device 123. The main body 121 is fixed to the pedestal 116 of the work table 110, and the nozzle head 122 and the image capture device 123 are attached to the main body 121. Accordingly, the head unit 120 moves with the mobile cradle 112 and the pedestal 116, and is therefore mobile in the longitudinal direction and the short direction of the base 111. Further, the main body 121 houses a drive circuit that controls operation of the nozzle head 122, the drive circuit being connected to the control device via a communication cable 103.

Figure 8:
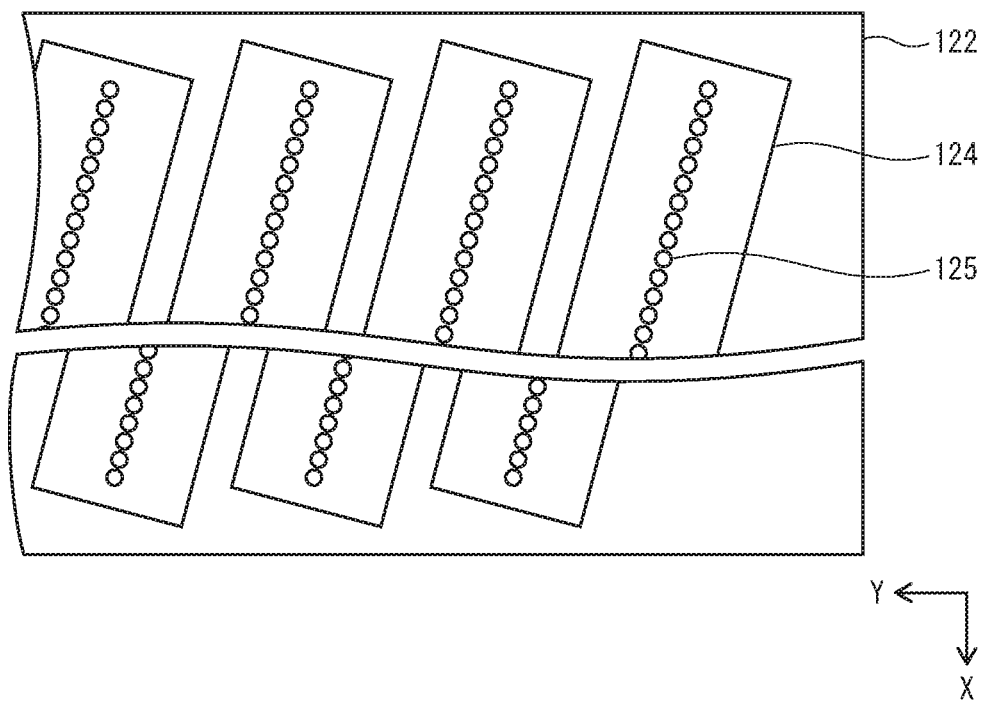
FIG. 8 is a schematic bottom view of a nozzle head 122.

The nozzle head 122 is an elongated member that extends in the short direction of the base 111. FIG. 8 is a schematic bottom view of the nozzle head 122. Rectangular sub heads 124 are arranged along a longitudinal direction of the nozzle head 122 (i.e., the short direction of the base 111) on a bottom surface of the nozzle head 122. Further, nozzles 125 are arranged on the sub heads 124 in equally spaced columns along a longitudinal direction of the sub heads 124. Each of the sub heads 124 is fixed at a longitudinal central portion thereof to the nozzle head 122, and is rotatable relative to the nozzle head 122 in a direction parallel to top surface of the base 111 around a center of the central portion. In the inkjet device 100, the sub heads 124 are rotatable relative to the nozzle head 122, and therefore intervals (pitch) of the nozzles 125 along the longitudinal direction (Y direction) of the nozzle head 122 can be adjusted for ink application. This rotation of the sub heads 124 is controlled by the control device via a drive circuit of the main body 121.

Figure 9:
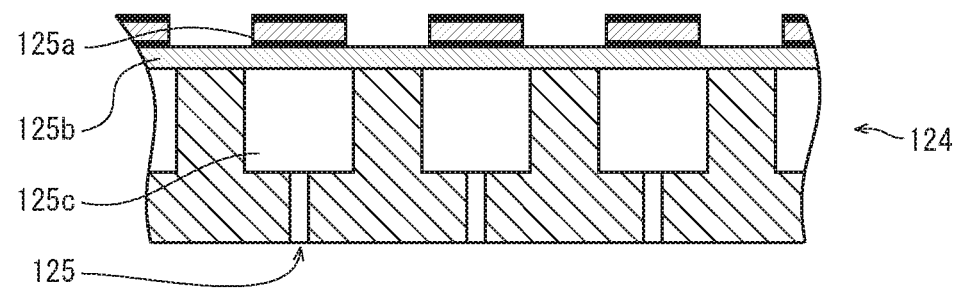
FIG. 9 is a schematic cross section of a sub head 124.

FIG. 9 is a schematic cross section of one of the sub heads 124. A plurality of the nozzles 125 are arranged in the sub head 124, and eject ink from an opening at a bottom surface of the sub head 124. Further, piezoelectric elements 125*a* are disposed corresponding to the plurality of the nozzles 125 at a top surface of the sub head 124, and liquid chambers 125*c* are disposed below the piezoelectric elements 125*a* via a vibration plate 125*b*.

The piezoelectric elements 125*a* are connected to the control device via a drive circuit of the main body 121, and deform the vibration plate 125*b* in response to signals from the control device. The vibration plate 125*b* is a plate shaped member common to the plurality of nozzles, is deformed by the piezoelectric elements 125*a*, and applies pressure to the liquid chambers 125*c* below the piezoelectric elements 125*a*. The liquid chambers 125*c* are filled with ink supplied from an ink tank (not illustrated) via an infusion tube 104 shown in FIG. 7, and cause ink to be ejected from the openings of the nozzles 125 according to pressure applied from vibration plate 125*b*. In other words, in the inkjet device 100, ejection amount and ejection timing of ink can be independently controlled for each of the nozzles 125 by the control device.

The image capture device 123 is, for example, a charge-coupled device (CCD) camera, and connected to the control device via a communication cable 105. The image capture device 123 captures an image of the substrate top surface 210 and transmits image data to the control device. Thus, the control device can detect position of the head unit 120 (the nozzles 125) relative to the substrate top surface 210, and accurately apply ink at predefined positions of the substrate top surface 210 from the nozzles 125. Further, according to the image data, the control device can detect application locations and application amounts on the substrate 200 of ink ejected from the nozzles 125.

b. Usage of Inkjet Device 100

The following describes an example of a method of using the inkjet device 100 when the substrate 200 is the substrate 11.

First, the substrate 11 on which the application regions 15*a* are formed is mounted on the base 111. At this time, the substrate 11 is mounted so the X direction, which is the longitudinal direction of the substrate 11, is parallel to the longitudinal direction of the base 111, and the Y direction, which is the short direction of the substrate 11, is parallel to the short direction of the base 111. That is, the substrate 11 is mounted so that the Y direction, which is the extension direction of the application regions 15*a*, matches the extension direction of the nozzle head 122. Accordingly, in the following, the longitudinal direction and short direction of the base 111 are also the X direction and the Y direction, respectively, as shown in FIG. 7. Note that the substrate is mounted so the application regions 15*a*, that is the upper surface of the substrate 11, is facing upwards. In other words, as shown in FIG. 7, a direction perpendicular from the upper surface of the base 111, from the base 111 to the nozzles 125, is the Z direction.

Subsequently, the sub heads 124 are each rotated relative to the nozzle head 122 so that an angle between the longitudinal direction of the nozzle head 122 and longitudinal direction of the sub heads 124 is fixed to a predefined angle designed in advance. By setting the angle appropriately, intervals of the nozzles 125 along the longitudinal direction (Y direction) of the nozzle head 122 can be set to constant regular intervals. At this time, the nozzles 125 of the sub heads 124 are arranged in regular interval columns along the longitudinal direction of the sub heads 124, and the columns of the nozzles 125 are arranged along the Y direction.

Subsequently, based on the image data of the image capture device 123, the servomotor unit 117 is driven to move the head unit 120 along the Y direction, in order to adjust position along the Y direction of the nozzle head 122 relative to the substrate 11. Further, the linear motor units 115*a*, 115*b* are driven to move the head unit 120 so as to bring the nozzle head 122 to one end in the X direction of the substrate 11. Thus, the nozzles 125 can be arranged into a plurality of columns along the Y direction (column direction) above the substrate 11.

Subsequently, the linear motor units 115*a*, 115*b* are driven to move the head unit 120 along the X direction to the other end in the X direction of the substrate 11. When moving, based on the image data of the image capture device 123, nozzles 125 eject ink while passing over the application regions 15*a*. That is, nozzles 125 eject ink to the application regions 15*a* while scanning across the substrate 11 along the X direction (row direction) of the upper surface of the substrate 11. Thus, ink is applied to the application regions 15*a*.

Ink application using the inkjet device 100 can be performed as described above. Here, in the method for manufacturing the panel 10, the nozzles 125 of the inkjet device 100 are classified as follows.

c. Classification of Nozzles 125

In the method for manufacturing the panel 10, prior to the ink application, a defective nozzle is selected in advance from the nozzles 125. A defective nozzle is one of the nozzles 125 for which an inspection result, described later, does not fall within use criteria. When ink is applied, ink is only ejected from use-nozzles that are not selected as a defective nozzle among the nozzles 125. By not ejecting ink from a defective nozzle, ink application accuracy is increased, and occurrences such as ink color mixing, short and leaks from functional layer malformation, and luminance unevenness from uneven film thickness of functional layers can be decreased.

Further, in the method for manufacturing the panel 10, at least one reserve nozzle is present among the nozzles 125. A reserve nozzle is a nozzle that, when applying ink, is not one of the use-nozzles, is not selected as a defective nozzle, passes over the application regions 15a, and does not eject ink. Results of this are described below.

Figure 10A:
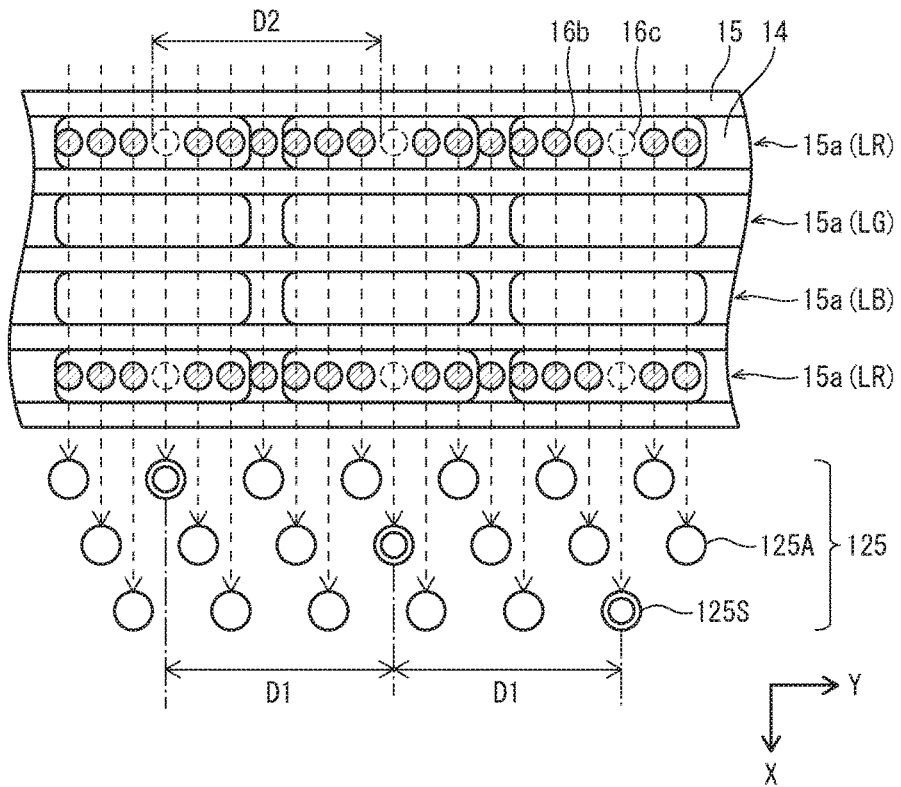
FIG. 10A and FIG. 10B are schematic plan views for describing ink application.
Figure 10B:
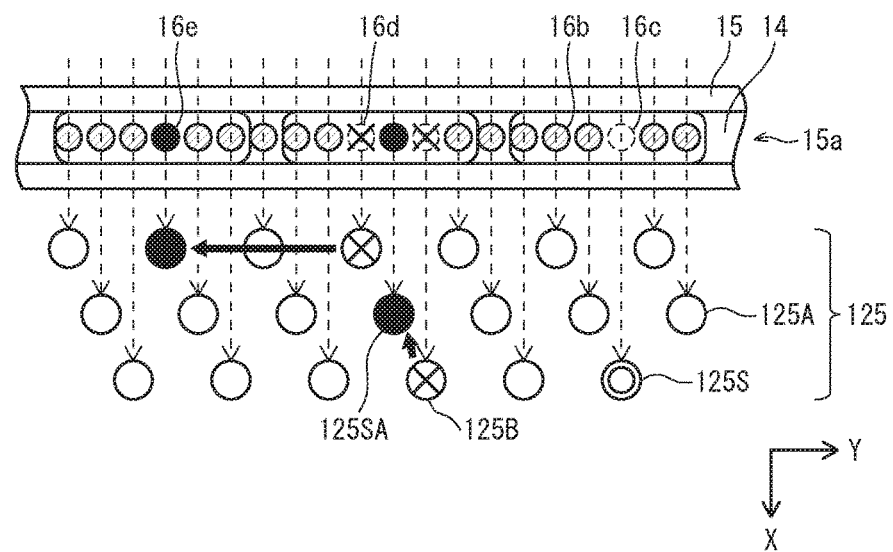

FIG. 10A and FIG. 10B are schematic plan views for describing ink application according to the method for manufacturing the panel 10. Here, as an example, a case is described in which ink is applied only to application regions 15a(LR) that, among the application regions 15a, form the sub pixel columns LR. Note that the nozzles 125 shown in FIG. 10A and FIG. 10B pass over all of the application regions 15a.

FIG. 10A is a diagram for describing a state prior to defective nozzle occurrence, in which each of the nozzles 125 is a use-nozzle 125A indicated by a single circle or a reserve nozzle 125S indicated by a double circle. Here, when applying ink, there is at least one reserve nozzle 125S present, aside from the use-nozzles 125A. More specifically, in FIG. 10A, among 20 of the nozzles 125, 17 are use-nozzles 125A, and three are reserve nozzles 125S.

While the nozzles 125 are scanned along the X direction, ink is ejected only from the use-nozzles 125A one time for each of the application regions 15a(LR). At this time, in each of the application regions 15a(LR) in the range shown in FIG. 10A, there are 17 ink application locations 16b scanned by the use-nozzles 125A and three non-application locations 16c scanned by the reserve nozzles 125S.

Next, a case is considered in which a defective nozzle occurs after sequentially applying ink to a plurality of the substrate 11 from the state shown in FIG. 10A. FIG. 10B is a diagram for describing a state after defective nozzle occurrence. Prior to applying ink, two defective nozzles 125B, indicated by crosses, are newly selected.

In this case, in the range shown in FIG. 10B, two of the application locations 16b in each of the application regions 15a(LR) become application unsuitable locations 16d scanned by defective nozzles 125B. In a case in which ejection amounts of the use-nozzles 125A are not changed from the state shown in FIG. 10A, a decrease in the application locations 16b leads to a decrease in ink application amount to the application regions 15a(LR).

Here, in the method for manufacturing the panel 10, if two of the three reserve nozzles 125S are changed to use-nozzles 125SA, the number of the use-nozzles 125A, 125SA can be maintained at 17, which is the same as in FIG. 10A. Thus, a decrease in ink application amount can be supplemented even in the range shown in FIG. 10B, in which two substitute application locations 16e are added to each of the application regions 15a(LR) so that a total of the application locations 16b and the substitute application locations 16e is 17. Further, according to this method, shortening a shortest ejection interval of the nozzles 125 and increasing an ejection amount of the use-nozzles 125A, 125SA are not required.

That is, according to the method for manufacturing the panel 10, the reserve nozzles 125S are secured, and therefore even when defective nozzles 125B occur, a decrease in ink application amount can be supplemented by changing reserve nozzles 125S to use-nozzles 125SA. Thus, according to the method for manufacturing the panel 10, a decrease in ink application amount due to occurrence of defective nozzles 125B can be supplemented by a simple method while suppressing a decrease in manufacturing efficiency.

Further, as above, as in FIG. 10A and FIG. 10B, a decrease in ink application amount due to occurrence of defective nozzles 125B can be supplemented even when the number of ink ejections for each of the nozzles 125 to each of the application regions 15a is at most one. That is, according to the method for manufacturing the panel 10, even in the panel 10 of high resolution in which the interval between adjacent ones of the banks 15 is smaller than the shortest ejection interval of ink of each of the nozzles 125 of the inkjet device 100, high efficiency and high quality manufacturing is possible.

d. Setting Nozzles 125

Specifics of settings of the nozzles 125 are described below, including setting the reserve nozzles 125S and changing the reserve nozzles 125S to the use-nozzles 125SA. First, in the inkjet method used in the method for manufacturing a plurality of the panel 10, ink application is sequentially performed on a plurality of the substrate 11. Further, according to the inkjet method, initial nozzle setting is performed prior to starting ink application, and nozzle supplement setting is performed each time ink application is completed for a defined plurality of the substrate 11.

(a) Initial Nozzle Setting

Figure 11:
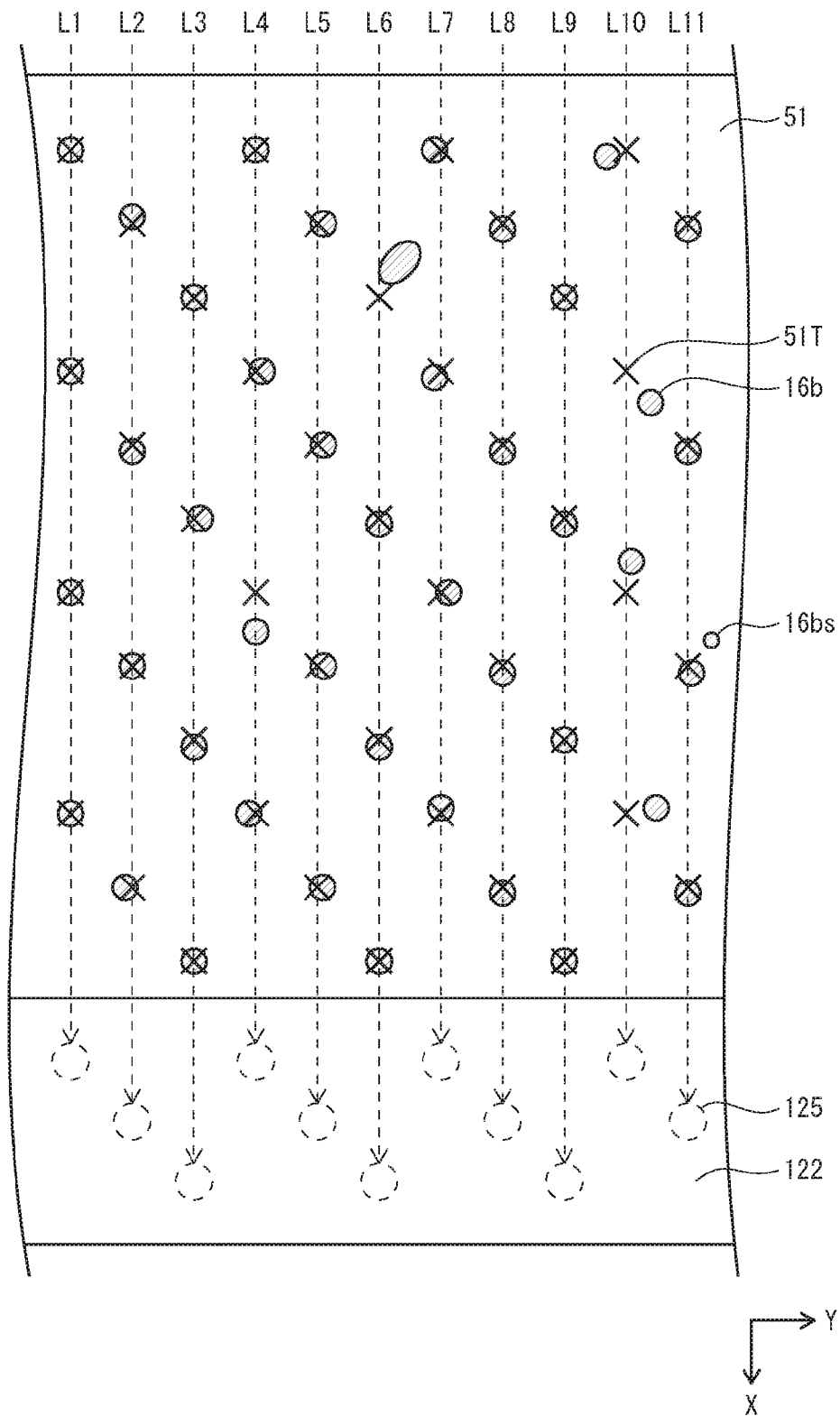
FIG. 11 is a schematic plan view for describing nozzle inspection.

In initial nozzle setting, first each of the nozzles 125 is inspected. FIG. 11 is a schematic plan view for describing nozzle inspection. In the inspection, first an inspection substrate 51 is prepared, on a top surface of which target locations 51T are disposed. Here, the top surface of the inspection substrate 51 corresponds to a planar inspection region in the present embodiment. Note that the planar inspection region is not limited to being the top surface of the inspection substrate 51 and may be, for example, a frame region of the panel 10, a top surface of paper mounted on a top surface of the substrate 111, or the like.

The target locations 51T, as an example, may be indicated by a cross symbol in plan view, disposed at constant intervals in the X direction along the top surface. Further, columns of such examples of the target locations 51T (L1 to L11 in FIG. 11) are disposed at constant intervals in the Y direction along the top surface, perpendicular to the X direction. Further, adjacent columns of the target locations 51T are shifted along the X direction relative to each other.

Note that for the inspection substrate 51, many columns of the target locations 51T are present other than the columns L1 to L11 shown in FIG. 11. Further, the target locations 51T are not limited in shape or material as long as they can be recognized by the image capture device 123 or the like. For example, round shapes, polygonal shapes, linear shapes, or the like may be formed on the top surface of the inspection substrate 51 by etching, plating, ink application, or the like.

The inspection substrate 51 as above is mounted on the base 111 of the inkjet device 100, the top surface of the inspection substrate 51 being disposed below the nozzles 125. Thus, the inspection substrate 51 is disposed so that the longitudinal direction of the nozzle head 122 (short direction of the base 111) is parallel to the X direction of the inspection substrate 51 and the scanning direction of the nozzles 125 (longitudinal direction of the base 111) is parallel to the Y direction of the inspection substrate 51.

Subsequently, the nozzle head 122 is moved in the X direction and the Y direction to a position covering an X-direction end portion of the inspection substrate 51 (in FIG. 11, an end-portion towards the top of the diagram). Furthermore, the sub heads 124 are rotated so the nozzles 125 are adjusted to positions that pass through the columns of the target locations 51T. At this time, a plurality of the target locations 51T are present for each of the nozzles 125 to pass over, and since ejection results can be inspected a plurality of times for each of the nozzles 125, inspection accuracy is improved. Further, the application locations of ink ejected from nozzles 125 that are adjacent in the Y direction are shifted in the X direction, and therefore ink connections are suppressed and inspection errors reduced.

Subsequently, the nozzle head 122 is moved along the X direction, thereby ejecting ink to the target locations 51T of the inspection substrate 51 from the nozzles 125 while the nozzles 125 scan across the top surface of the inspection substrate 51. At this time, an application state on the inspection substrate 51 of ink ejected from the nozzles 125 is inspected. More specifically, for each ejection of ink, data on deviation from the target locations 51T and application area of the application locations 16b is acquired as an application state via the image capture device 123. At this time, as in the case of ink ejected to the third one from the top of the target locations 51T in column L11 in FIG. 11, ink from one ejection splits and two or more of the application locations 16b occur. Accordingly, whether or not two or more of application locations 16bs exist for one of the target locations 51T is also inspected as an application state. Thus, ejection accuracy of each of the nozzles 125 can be evaluated from the application state of the nozzles 125. Further, application states for inspection are not limited to those described above, and application states such as application volume may be inspected.

Subsequent to the inspection, based on use criteria determined in advance, nozzles 125 for which an inspection result falls outside the use criteria are selected as defective nozzles 125B. Note that the use criteria are determined based on factors such as function of the inkjet device 100, shape of the application regions 15a of the substrate 11, and quality required for the panel 10. For example, a use criteria may be that in multiple ejections of one of the nozzles 125, all of the application locations 16b of ink are at least partially connected to the target locations 51T (i.e., not completely separate). In this case, in FIG. 11, for nozzles 125 that ejected to columns L4, L6, LID, a portion of the application locations 16b (for example, third from the top of column L4, first from the top of column L6, and second to fourth from the top of column L10) are completely separate from the target locations 51T, and therefore these nozzles 125 are selected as defective nozzles 125B. Further, for the one of the nozzles 125 that ejected to the column L11, the application location 16bs that is completely separate from the target locations 51T is present, and therefore this nozzle is selected as one of the defective nozzles 125B.

Note that use criteria may be based on the application locations 16b of ink as described above, or in addition to the application locations 16b of ink, reproducibility (variation) of ink application area (application amount) may be considered. Further, use criteria may select nozzles 125 for which two or more of the application locations 16bs are present for one of the target locations 51T to uniformly be defective nozzles 125B, regardless of positions of the application locations 16bs relative to the target locations 51T. Further, use criteria may be set so that when the application locations 16bs only deviate in the Y direction in FIG. 11, relative to the target locations 51T, corresponding nozzles 125 are not selected as defective nozzles 125B.

Subsequently, among the nozzles 125, for nozzles that pass over the application regions 15a when applying ink and are not selected as a defective nozzle 125B, one or more are set to be a use nozzle 125A and one or more are set to be a reserve nozzle 125S. For example, in the example of use criteria above, in FIG. 11, nozzles 125 that eject to the columns L1 to L3, L5, and L7 to L9 are not selected as defective nozzles 125B. Further, when applying ink, nozzles 125 that ejected ink to columns L2, L3, L5, and L7 to L9 are assumed to be nozzles that pass over the application regions 15a. In this case, for example, nozzles 125 that ejected to L2, L5, L7, and L9 can be set as use nozzles 125A, and nozzles that ejected to L3 and L8 can be set as reserve nozzles 125S.

According to the initial nozzle setting above, in subsequent ink application, among the nozzles 125, among nozzles that pass over the application regions 15a and are not selected as a defective nozzle 125B, at least one reserve nozzle 125S, which does not eject ink, is present other than the use nozzles 125A.

Note that in the initial nozzle setting, it is preferable to set a plurality of the reserve nozzles 125S at constant intervals. For example, in FIG. 10A, reserve nozzles 125S are set at intervals D1. By setting a plurality of the reserve nozzles 125S, the probability of an insufficiency of the reserve nozzles 125S when a plurality of defective nozzles 125B occurs is decreased. Further, by setting the reserve nozzles 125S at constant intervals, it is possible to suppress variation in shortest distance from a reserve nozzle 125S to a position of a defective nozzle 125B that occurs after initial nozzle setting. For example, in FIG. 10A, when a new defective nozzle 125B occurs, a shortest distance to a reserve nozzle 125S can be set to D1/2 or less. Flow of applied ink is limited along the application regions 15a, and by suppressing variation of the shortest distance, it is possible to suppress variation in ink application thickness in the application regions 15a.

Further, when a plurality the reserve nozzles 125S are set at constant intervals in the initial nozzle setting, the constant interval is preferably set to be equal to or less than a distance between centers of adjacent ones of the first electrodes 12, among a plurality of the first electrodes 12 arranged along one column of the application regions 15a. For example, in FIG. 10A, a distance between centers of adjacent ones of the first electrodes 12 is indicated by D2, and a constant interval D1 set for the reserve nozzles 125S is equal to D2. Thus, at least one reserve nozzle 125S passes over each position in which one of the first electrodes 12, that is one of the sub pixels SPR, SPG, SPB, is formed. Accordingly, even if a defective nozzle 125B occurs after initial nozzle setting, a reserve nozzle 125S that passes over an application position of a corresponding sub pixel SPR, SPG, SPB is present, and therefore variation in ink application thickness can be further suppressed.

(b) Nozzle Supplement Setting

In nozzle supplement setting, first the nozzles 125 are inspected, similarly to the initial nozzle setting. Content and method of this inspection is the same as in the initial nozzle setting.

Subsequently, a use nozzle 125A, 125SA for which an inspection result falls outside use criteria is changed to a defective nozzle 125B. For example, with respect to the inspection results of FIG. 11, prior to nozzle supplement setting, it can be assumed that a nozzle 125 that ejected to the column L11 is a defective nozzle 125B, nozzles 125 that ejected to the columns L3, L6, L9 are reserve nozzles 125S, and the other seven nozzles 125 are all use nozzles 125A. Further, use criteria are assumed to be the same as the example described above. In this case, use nozzles 125A that ejected to the columns L4, L10 are changed to defective nozzles 125B.

Subsequently, depending on the number of nozzles changed from use nozzles 125A 125SA to defective nozzles 125B, reserve nozzles 125S are changed to use nozzles 125SA. For example, in the example above, two nozzles are changed from use nozzles 125A to defective nozzles 125B. Thus, the reserve nozzles 125S that ejected to the columns L3 and L9 are changed to use nozzles 125SA. Thus, the number of use nozzles can be kept constant before and after nozzle supplement setting. Accordingly, the method for manufacturing can supplement a decrease in ink application amount due to occurrence of a defective nozzle by a method that is simple and suppresses a decrease in manufacturing efficiency.

Note that in nozzle supplement setting, a reserve nozzle 125S for which an inspection result falls outside use criteria is also preferably changed to a defective nozzle 125B. For example, in the example above, the reserve nozzle 125S that ejected to the column L6 is changed to a defective nozzle 125B. Even a nozzle that is not selected as a defective nozzle 125B in initial nozzle setting and subsequently does not eject ink, such as a reserve nozzle 125S, may decrease in ink ejection accuracy due to changes over time in openings of nozzles 125 and changes in ink state of the liquid chambers 125c. Accordingly, by changing such reserve nozzles 125S to defective nozzles 125B, it is possible to remove reserve nozzles 125S for which ink ejection accuracy decreases after initial nozzle setting from candidacy for use nozzles 125SA.

Further, in nozzle supplement setting, various selection methods may be considered for selecting a reserve nozzle 125S to be changed to a use nozzle 125SA. For example, in nozzle supplement setting, a closest reserve nozzle 125S to a nozzle changed from a use nozzle 125A, 125SA to a defective nozzle 125B may be changed to a use nozzle 125SA. More specifically, as shown in FIG. 10B, of the two nozzles changed to defective nozzles 125B and marked by a cross symbol, regarding the right-side defective nozzle 125B, a reserve nozzle 125S that is closest on a left-side among reserve nozzles 125S to the right and left is changed to a use nozzle 125SA.

As stated above, flow of applied ink along the application regions 15a is limited, but according to the method described above, an alternative application location 16e that is closest to an application unsuitable location 16d can be set, and variation of ink application thickness in the application regions 15a can be suppressed. Note that when position of a defective nozzle 125B changed from a use nozzle 125A, 125SA is in a formation location of a sub pixel SPR, SPG, SPB, it is preferable to change a reserve nozzle 125S that is in the formation location of the same sub pixel SPR, SPG, SPB to a use nozzle 125SA. Thus, variation in ink application thickness can be further suppressed. Note that when a reserve nozzle 125S in the formation location of the same sub pixel SPR, SPG, SPB is not present, it suffices that a closest reserve nozzle 125S is changed to a use nozzle 125SA.

Further, in nozzle supplement setting, according to an inspection result, priority may be assigned to reserve nozzles 125S, and of two or more reserve nozzles 125S closest to a defective nozzle 125B changed from a use nozzle 125A, 125SA, a reserve nozzle 125S having a highest priority may be changed to a use nozzle 125SA. In FIG. 11, when use criteria are the same as in the example described above, nozzles 125 that ejected to the columns L1 to L3, L5, and L7 to L9 fall within the use criteria, but even for these nozzles 125 there is variation in ejection accuracy.

First, in the column L1, deviation from the target locations 51T of all the application locations 16b is small. Further, in the columns L9, L3, and L2, one, two, and three application locations 16b, respectively, deviate from the target locations 51T. Further, in the columns L5, L7, and L8, four of the application locations 16b deviate from the target locations 51T. However, in the columns L5, L8, a direction of deviation is consistently in one direction, and in the column L7 direction of deviation varies with each application.

In this case, each of the nozzles 125 within the use criteria can be evaluated in an order L1>L8>L5>L9>L3>L2>L7 of high ejection accuracy, based on the ejection columns. Here, by adjusting ink ejection timing of L8 the same result as that of L1 can be obtained and therefore L8 is evaluated as next after L1. Further, because of shape of the application regions 15a the influence of deviation in the Y direction is considered to be small, and therefore L5 is evaluated higher than L9, L3, L2, for which deviation in the X direction occurred. In this way, priority of the reserve nozzles 125S can be assigned based on ejection accuracy. For example, when the reserve nozzles 125S are L1, L5, L9, a priority of L1>L5>L9 is assigned.

Figure 12:
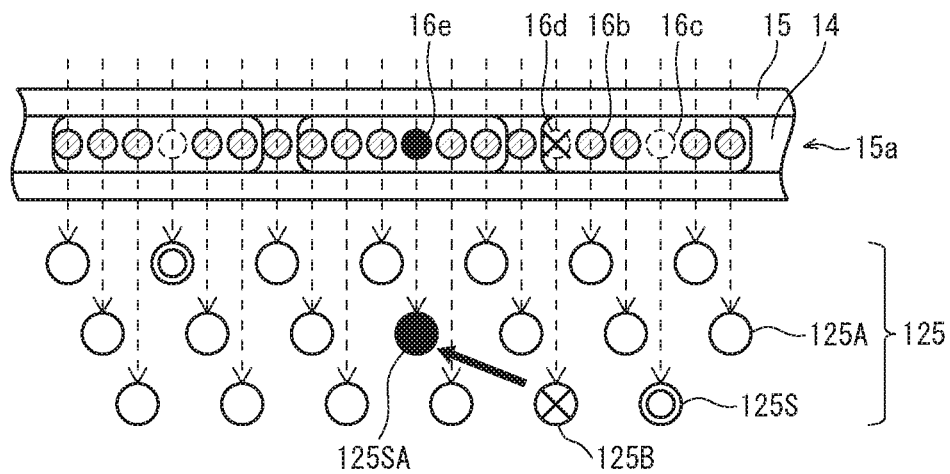
FIG. 12 is a schematic plan view for describing nozzle supplement setting.

FIG. 12 is a schematic plan view for describing nozzle supplement setting when using the priority described above. In FIG. 12, prior to nozzle supplement setting, the same disposition of use nozzles 125A and reserve nozzles 125S is used as in FIG. 10A. Next, in FIG. 12, in nozzle supplement setting, it is assumed that one use nozzle 125A (sixth nozzle from the right) is changed to a defective nozzle 125B. Here, reserve nozzles 125S near the defective nozzle 125B are present to the left and right, but when the priority of the reserve nozzle 125S to the left is higher, then regardless of distance from the defective nozzle 125B, the reserve nozzle 125S to the left is changed to a use nozzle 125SA. Thus, in applying ink after nozzle supplement setting, a nozzle 125 of higher ejection accuracy can be used, suppressing defective application and application unevenness.

Further, in nozzle supplement setting, a defective nozzle 125B for which inspection results fall within use criteria is preferably changed to a reserve nozzle 125S. In initial nozzle setting and nozzle supplement setting, a nozzle selected as a defective nozzle 125B may improve in ink ejection accuracy due to changes in openings of the nozzles 125 and states of the liquid chambers 125c over time.

For example, in FIG. 11, according to the example use criteria described above, the nozzles 125 the ejected to the columns L4, L6, L10, L11 are selected as defective nozzles 125B. However, when compared to the column L10 for which all the application locations 16b are completely separate from the target locations 51T, only one application location is completely separate or split for each of the columns L4, L6, L11. If, for example, the ejection defect in one location is not caused by the corresponding nozzle 125, or caused by something resolved by the passing of time, ejection accuracy of the nozzle 125 is likely to subsequently improve. As specific examples of such causes, cases may be considered such as a case in which a foreign particle attached to the inspection substrate 51 causes deviation of the application location 16b to be large, or hardening of ink attached to the nozzle 125 causing large deviation of the application location 16b, but the hardened ink is ejected at the same time as ink ejection. In particular, in the column L6 of FIG. 11, the first from the top of the application locations 16b that is completely separate from the target location 51T has an ink application surface greater than other application locations 16b, and is assumed to be caused by presence of a foreign particle or ejection of hardened ink. Accordingly, there is a possibility that the defective nozzle 125B that ejected to the column L6 subsequently improves in ejection accuracy.

Accordingly, for such a defective nozzle 125B, if inspection confirms an improvement in ejection accuracy, it is preferably changed to a reserve nozzle 125S, and added as a candidate for a use nozzle 125SA. Thus, the number of reserve nozzles 125S increases, and a length of time until insufficient reserve nozzles 125S can be increased.

Note that when the number of reserve nozzles 125S is insufficient in nozzle supplement setting, i.e., the number of nozzles changed from use nozzles 125A to defective nozzles 125B due to inspection results is greater than the number of reserve nozzles 125S, maintenance of the nozzles 125 is performed. Thus, ejection accuracy of the defective nozzles 125B is improved, and candidates for reserve nozzles are secured. After maintenance, by performing the initial nozzle setting again, if a candidate can be changed to a reserve nozzle 125S, ink application can be restarted. However, the maintenance may be periodically performed before an occurrence of insufficient reserve nozzles 125S.

4. Modifications

The above describes a method for manufacturing the panel 10 as one aspect of the present invention, but the present invention is not limited to the above description except for essential characteristic elements thereof. The following describes modifications of the method for manufacturing an organic EL display panel as other embodiments of the present invention. Note that in the following description, elements that are the same as in the above description are assigned the same reference signs, and description thereof is simplified or omitted.

(1) Initial Nozzle Setting

Figure 13:
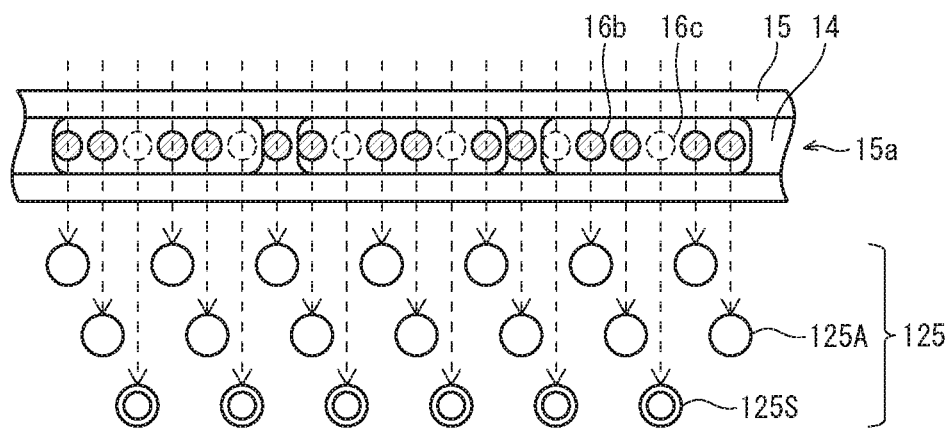
FIG. 13 is a schematic plan view for describing initial nozzle setting pertaining to a modification.

In FIG. 10A, in the initial nozzle setting, the constant interval D1 set for the reserve nozzles 125S is equal to the distance D2 between centers of adjacent ones of the first electrodes 12, but D1>D2 and D1<D2 are also possible. FIG. 13 is a schematic plan view for describing initial nozzle setting pertaining to a modification in which D1<D2. In FIG. 13, the reserve nozzles 125S are set so that two or more are present between each of the pixel restriction layers 14 (in each position in which a sub pixel SPR, SPG, SPB is to be formed). Thus, when a defective nozzle 125B occurs, a closer reserve nozzle 125S can be selected to change to a use-nozzle 125SA, and variation in ink application thickness within the application regions 15a can be further suppressed. Note that, in the initial nozzle setting of FIG. 13, when compared to the initial nozzle setting of FIG. 10A, the number of ink applications per application region is fewer, but with respect to this an ink ejection amount each time each of the nozzles 125 eject ink can be increased, or concentration of the functional material in the ink can be increased, thereby achieving a same film thickness of a functional layer formed.

Figure 14:
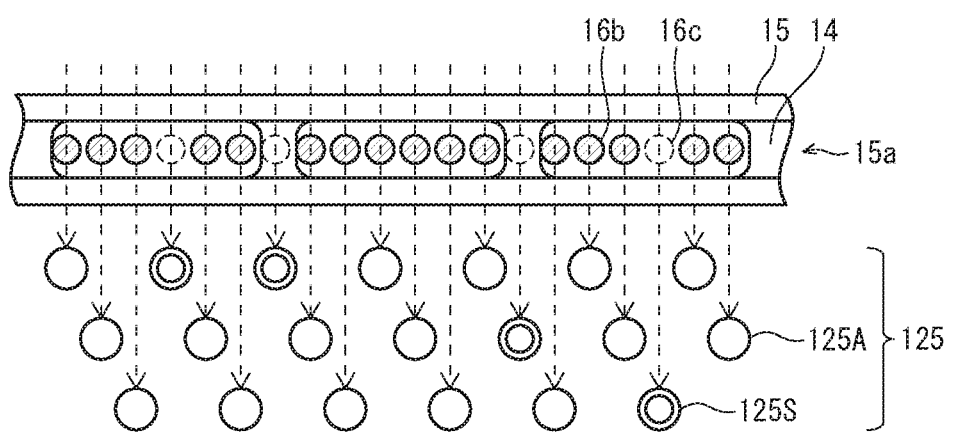
FIG. 14 is a schematic plan view for describing initial nozzle setting pertaining to a modification.

Further, in FIG. 10A, in the initial nozzle setting, the constant interval D1 is set for the reserve nozzles 125S, but the interval may be variable. FIG. 14 is a schematic plan view for describing initial nozzle setting pertaining to this modification. In FIG. 14 an interval of the reserve nozzles 125S is variable. Note that in FIG. 10A, in the initial nozzle setting, nozzles that scan over the pixel restriction layers 14 are set as use-nozzles 125A, but as shown in FIG. 14, the nozzles 125 may be set as reserve nozzles 125S. In particular, locations on the pixel restriction layers 14 are locations in which shorts and leaks due to malformation of a functional layer are less likely to occur, and by making such location non-application locations 16c, occurrence of shorts and leaks can be decreased.

(2) Shape of Banks

For the panel 10, a so-called line bank scheme is adopted as shown in FIG. 2, but the method for manufacturing an organic EL display panel pertaining to one aspect of the present invention is not limited to such a structure.

a. Sub Bank Disposition

Figure 15:
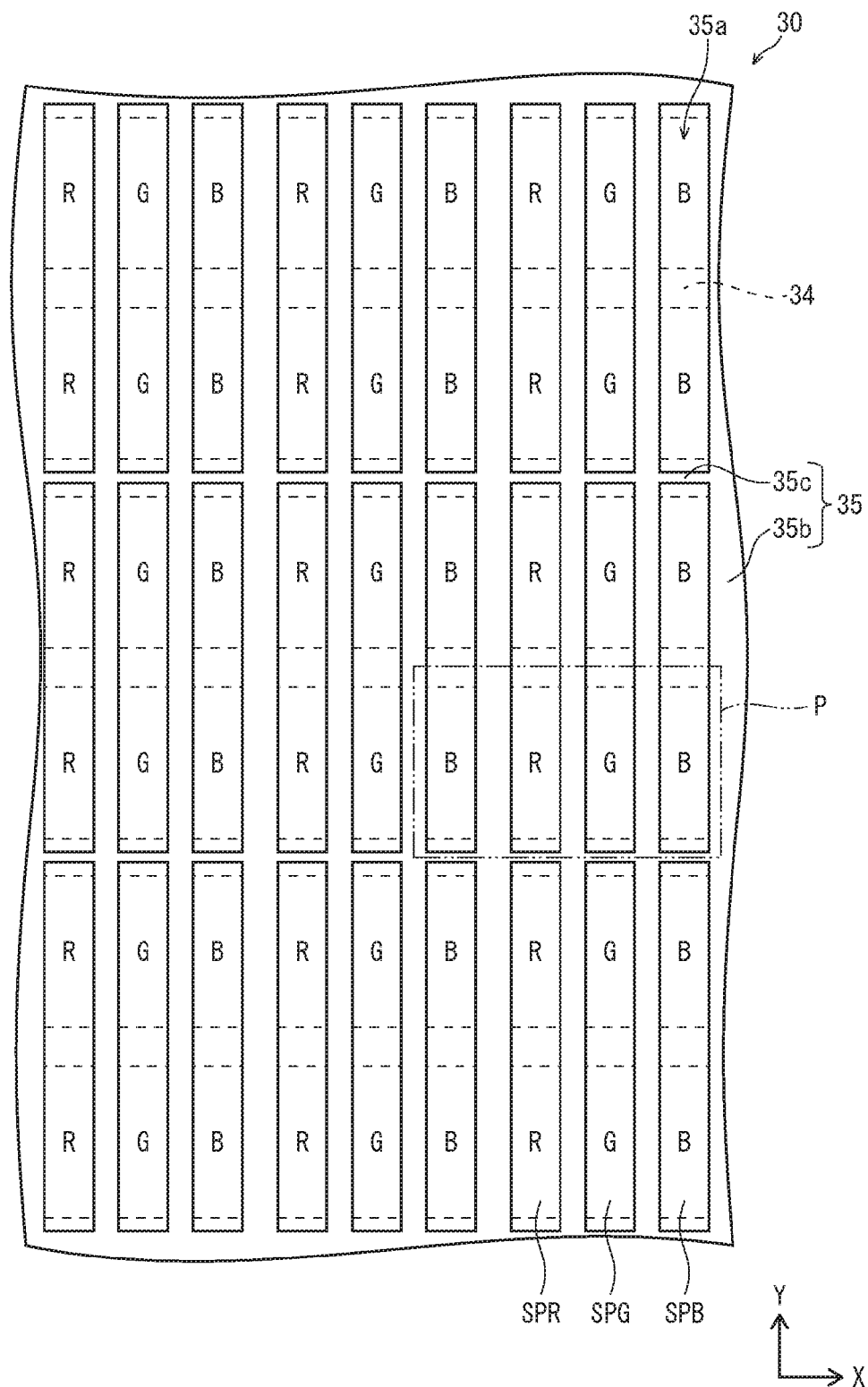
FIG. 15 is a schematic plan view of an enlargement of a portion of an image display surface of an organic EL display panel 30.

FIG. 15 is an enlarged schematic plan view of a portion of an image display surface of an organic EL display panel 30 (hereinafter, "panel 30"). The panel 30 includes insulating layers (pixel restriction layers) 34 and a bank layer 35 that are different shapes to their equivalents in the panel 10.

The pixel restriction layers 34 are rectangular in shape, having a different top surface shape to the pixel restriction layers 14. Thus, the pixel restriction layers 34 have a simple shape, making formation easier.

The bank layer 35 forms banks 35b that partition the first electrodes 12 into columns that extend in the Y direction (column direction), similarly to the banks 15, and sub banks 35c that partition columns of the first electrodes 12 in the Y direction at regular intervals, more specifically every two of the first electrodes 12. By forming the sub banks 35c, in ink application when forming the organic light-emitting layers 16B, even when ink flows over the banks 35b in the X direction into an adjacent one of application regions 35a, the ink cannot overflow the sub banks 35c, and therefore a range in which color mixing occurs can be decreased. In the panel 30, according to the bank layer 35, the application regions 35a are regions surrounded by banks 35b and sub banks 35c, and are arranged along the X direction (row direction) and the Y direction.

The pixel restriction layers 34 and the bank layer 35 can be formed by, for example, appropriate setting of shapes of light-transmissive portions and light-shielding portions of a photomask used in a photolithography method.

In the method for manufacturing the panel 30, at least one reserve nozzle 125S that does not eject ink is present among the nozzles 125 as a nozzle not selected as a defective nozzle 125B that passes over the application regions 35a. Further, in ink application when using the inkjet method in which ink is applied to a sequence of a plurality of the substrate 11, initial nozzle setting is performed prior to starting ink application, and nozzle supplement setting is performed each time ink application is completed for a defined plurality of the substrate 11.

That is, according to the above manufacturing method, reserve nozzles 125S are secured, and therefore even when defective nozzles 125B occur, a decrease in ink application amount can be supplemented by changing reserve nozzles 125S to use-nozzles 125SA. In other words, according to the manufacturing method, a decrease in ink application amount due to occurrence of a defective nozzle 125B can be supplemented by a method that is simple and suppresses a decrease in manufacturing efficiency.

Note that in the method for manufacturing the panel 30, when applying ink, the number of reserve nozzles 125S that passes over each of the application regions 35a that are arranged along the Y direction is preferably at least one. In ink application, applied ink cannot overflow the sub banks 35c, but according to the above a reserve nozzle 125S is present for each of the application regions 35a partitioned by the sub banks 35c, and therefore supplementing a decrease in ink application amount can be implemented for an occurrence of a defective nozzle 125B over any of the application regions 35a.

b. Pixel Bank Method

Figure 16:
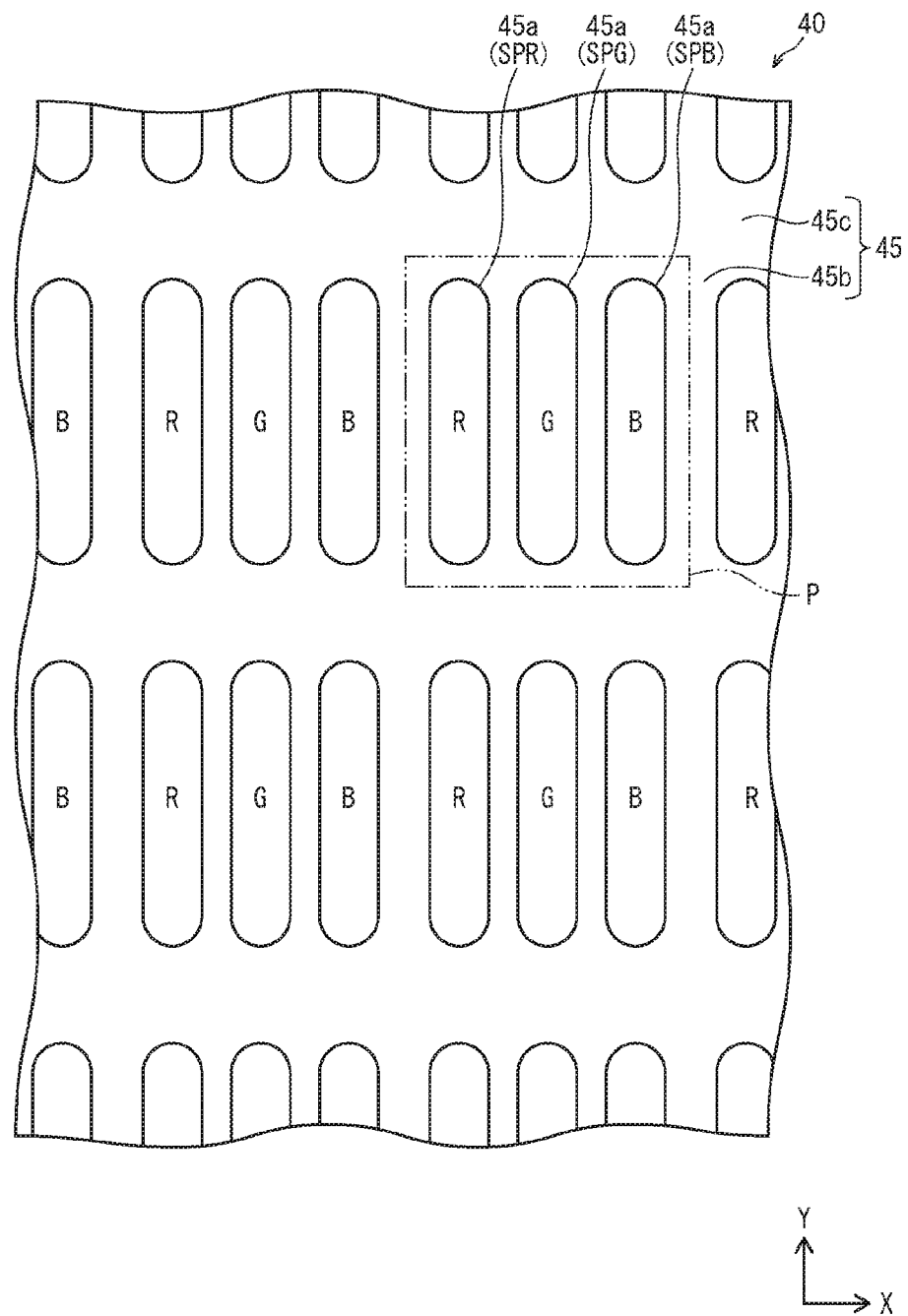
FIG. 16 is a schematic plan view of an enlargement of a portion of an image display surface of an organic EL display panel 40.

FIG. 16 is an enlarged schematic plan view of a portion of an image display surface of an organic EL display panel 40 (hereinafter, "panel 40"). The panel 40 includes a grid-like bank layer 45, using a so-called pixel bank system.

The bank layer 45 is formed from banks 45b and sub banks 45c that partition the first electrodes 12 into single electrodes. The application regions 45a are regions surrounded by the banks 45b and the sub banks 45c, and are arranged along the X direction (row direction) and the Y direction (column direction). Note that the bank layer 45 corresponds to a case in which the sub banks 35c of the bank layer 35 partition the columns of the first electrodes 12, which extend in the Y direction, into single electrodes. The bank layer 45 can be formed by, for example, appropriate setting of shapes of light-transmissive portions and light-shielding portions of a photomask used in a photolithography method.

In the method for manufacturing the panel 40, at least one reserve nozzle 125S that does not eject ink is present among the nozzles 125 as a nozzle not selected as a defective nozzle 125B that passes over the application regions 45a. Further, according to the inkjet method in which ink application is performed sequentially on a sequence of a plurality of the substrate 11, initial nozzle setting is performed prior to starting ink application, and nozzle supplement setting is performed each time ink application is completed for a defined plurality of the substrate 11.

That is, according to the above manufacturing method, reserve nozzles 125S are secured, and therefore even when defective nozzles 125B occur, a decrease in ink application amount can be supplemented by changing reserve nozzles 125S to use-nozzles 125SA. In other words, according to the manufacturing method, a decrease in ink application amount due to occurrence of a defective nozzle 125B can be supplemented by a method that is simple and suppresses a decrease in manufacturing efficiency.

Note that in the method for manufacturing the panel 40, when applying ink, the number of reserve nozzles 125S that passes over each of the application regions 45a that are arranged along the Y direction is preferably at least one.

(3) Other

According to the inkjet device 100 there is one of the nozzle head 122, but the inkjet device 100 may include a plurality of the nozzle head 122. In this case, applied ink may be changed for each of the nozzle heads 122, and therefore during the forming of the hole transport layers 16A and each color of the organic light-emitting layers 16B, the same inkjet device 100 can be used without replacing ink.

Further, in the inkjet device 100, the nozzles 125 are scanned by moving the head unit 120 over the substrate 200 mounted on the base 111, but methods of nozzle scanning are not limited to this example. For example, using an inkjet device in which the base is movable relative to a fixed head unit, nozzles may be scanned relative to the substrate by moving the base.

For ease of description, in FIG. 10A to FIG. 14, each of the sub heads 124 is depicted having three of the nozzles 125, but the number of the nozzles 125 on each of the sub heads 124 is not limited to this example, and the number may be high, such as 100, for example, or may be lower, such as 1, for example. Further, the nozzles 125 may be disposed directly on the nozzle head 122 without the sub heads 124.

Further, in FIG. 10A to FIG. 14, the longitudinal direction of the sub heads 124 is tilted relative to the X direction (scanning direction), and therefore the nozzles 125 (nozzle columns) arranged in columns above the substrate 11 or the inspection substrate 51 are arranged in a plurality along the Y direction (column direction), but there may be only one such nozzle column. Note that it suffices that a direction in which the nozzles 125 are arranged in a column is a direction tilted with respect to the X direction (scanning direction) on a surface parallel to an XY plane.

Further, in the panel 10, 30, 40, banks are formed partitioning the first electrodes 12 into columns extending along the Y direction, but may alternatively be formed partitioning the first electrodes 12 into columns extending along the X direction, that is, along the longitudinal direction of the substrate 11. In this case, when applying ink, it suffices that the substrate 200 is rotated 90 degrees on the base 111 in FIG. 7, the longitudinal direction of the nozzle head 122 is parallel to the X direction, and scanning direction of the nozzles 125 is parallel to the Y direction.

Further, in the panel 10, 30, 40, the row direction and the column direction of the first electrodes 12 are parallel to the long edge (X direction) and short edge (Y direction), respectively, of the top surface of the substrate 11, but this is just an example and the shape of the matrix in which the first electrodes 12 are arranged can be formed independently of a shape of the top surface of the substrate 11.

Further, according to the panel 10, functional layers formed by the inkjet method, i.e., by ink application to the application regions 15a from the nozzles 125, are the hole transport layers 16A and the organic light-emitting layers 16B, but the functional layers are not limited to these examples. In the method for manufacturing the panel 10, it suffices that at least one functional layer is formed by the inkjet method, and a functional layer may be an organic light-emitting layer, a hole or electron injection layer, a hole or electron transport layer, a hole or electron blocking layer, a buffer layer, or the like. Further, one functional layer formed by the inkjet method may be formed for each of the sub pixels SPR, SPG, SPB, or three or more may be formed. For example, the functional layer may be one of a hole transport layer and an organic light-emitting layer, and the other may be formed by using a dry process, for example. In such a case, any shape of a functional layer Ruined by a dry process may be adopted, for example, the functional layer may be formed independently for each sub pixel or application region, and may be formed to be common to a plurality of sub pixels or a plurality of application regions. Further, for example, the functional layer may be just the organic light-emitting layers 16B, configured without the hole transport layers 16A. Furthermore, for example, the hole injection layers 13 and the electron transport layer 17 may be formed in the application regions 15a by using dry processes.

Note that in the method for manufacturing the panel 10, a three-color application method is adopted in which the organic light-emitting layers 16B include organic light-emitting materials that emit red, green, and blue light in the sub pixel columns LR, LG, LB, respectively, supporting full color display, but this is just an example. For example, a wavelength conversion system may be adopted in which organic light-emitting layers including organic light-emitting material that emits blue light are formed in the sub pixel columns LR, LG, and LB, above which a wavelength conversion layer such as a fluorescent layer is disposed, so as to convert blue emitted light to red light in the sub pixel columns LR and blue emitted light to green light in the sub pixel columns LG. Further, for example, a color filter layer may be disposed instead of the wavelength conversion layer.

Further, the substrate 11 and the inspection substrate 51 are described as having rectangular upper surfaces, but they may have polygonal shapes such as triangular, square, or pentagonal, circular shapes, elliptical shapes, or a combination of any of these.

Further, according to the panel 10, 30, 40, sub pixels SPR, SPG, SPB are disposed, which emit red, green, and blue light, respectively, but this combination of sub pixels is just an example and configurations only using red light, or using the four colors red, green, blue, and yellow are possible for example. Further, in one pixel P, sub pixels of one color are not limited to a count of one, and a plurality of each color of sub pixel may be disposed in one pixel P, for example two blue sub pixels SPB. Further, disposition of sub pixels in a pixel P is not limited to the order red, green, blue, and this order may be rearranged.

Further, in the panel 10 the first electrodes 12 are anodes and the second electrode 18 is a cathode, but the opposite structure may be adopted in which first electrodes are cathodes and a second electrode is an anode.

Further, in the panel 10, 30, 40, organic EL elements are formed in application regions, but a bus bar (auxiliary electrode) may be formed in a portion of the application regions in order to decrease influence of a voltage drop due to a resistance component of the second electrode 18.

Further, in the panel 10, is a top-emission active matrix organic EL display panel, but this is just an example and, for example, a bottom emission or a passive matrix may be adopted.

Further, in the panel 30, columns of the first electrodes 12 extending in the Y direction are sub-divided in regular intervals every two of the first electrodes 12 by the sub banks 35c, but intervals of the sub banks 35c in the Y direction are not limited to this example, and may be regular intervals of three or more of the first electrodes 12.

In the case of the above changes, composition and method for manufacturing a panel is appropriately changed.

INDUSTRIAL APPLICABILITY

The method for manufacturing the organic EL display panel pertaining to the present invention can be widely used in methods for manufacturing display panels for use in various electronic devices such as televisions, personal computers, portable terminals, commercial displays, and the like.

REFERENCE SIGNS LIST 10, 30, 40 Organic EL display panel
11 Substrate
12 First electrodes (electrodes)
15, 35b, 45b, 95 Banks
15a, 35a, 45a, 95a Application regions
35c, 45c Sub banks
16A Hole transport layers (functional layers)
16B Organic light-emitting layers (functional layers)
16a Ink
18 Second electrode
122 Nozzle head
124 Sub heads
125 Nozzles
125A, 125SA Use-nozzles
125B Defective nozzle
125S Reserve nozzle

The invention claimed is:

1. A method for manufacturing an organic electroluminescence (EL) display panel, the method comprising:
forming an organic EL element that includes one or more of a light emitting layer, a hole injection layer, an electron injection layer, a hole transport layer, an electron transport layer, a hole blocking layer, an electron blocking layer, and a buffer layer in application regions on a substrate by performing ink application, applying ink to the application regions according to an inkjet method performed sequentially on a sequence of substrates, by ejecting the ink from nozzles while the nozzles are scanned above and relative to a top surface of the substrate, the nozzles being arranged in a column direction over the substrate; and
according to the inkjet method, initial nozzle setting is performed prior to the ink application, and nozzle supplement setting is performed each time the ink application is completed for a certain number of the substrates,
wherein the initial nozzle setting includes
inspecting the nozzles and setting a nozzle for which an inspection result falls outside use criteria as a defective nozzle, and
setting, among the nozzles, among nozzles that are not selected as a defective nozzle and that do pass over the application regions during the ink application, one or more use-nozzles that eject the ink during the ink application and one or more reserve nozzles that do not eject the ink during the ink application, and
wherein the nozzle supplement setting includes
inspecting the nozzles and changing a use-nozzle for which an inspection result falls outside use criteria to a defective nozzle, and
maintaining a constant number of use-nozzles before and after the nozzle supplement setting by changing a number of reserve nozzles to use-nozzles according to a number of use-nozzles changed to defective nozzles.

2. The method of claim 1,
wherein in the inspecting of the nozzles in the initial nozzle setting and in the nozzle supplement setting,
a planar inspection region is disposed below the nozzles,
the nozzles eject the ink to the planar inspection region while the nozzles are scanned relative to the planar inspection region, and
an ink state of the ejected ink on the planar inspection region is inspected.

3. The method of claim 2,
wherein in the initial nozzle setting, a plurality of the reserve nozzles are set at regular intervals.

4. The method of claim 3,
wherein a plurality of electrodes are arranged in one column in the application regions, and the regular intervals are equal to or less than a distance between centers of adjacent ones of the electrodes.

5. The method of claim 1,
wherein in the nozzle supplement setting, a reserve nozzle closest to a nozzle changed from a use-nozzle to a defective nozzle is changed to a use-nozzle.

6. The method of claim 1,
wherein in the nozzle supplement setting, a reserve nozzle for which an inspection result falls outside use criteria is changed to a defective nozzle.

7. The method of claim 6,
wherein in the nozzle supplement setting
 a priority order is assigned to reserve nozzles according to inspection results, and
 among two or more reserve nozzles close to a nozzle changed from a use-nozzle to a defective nozzle a reserve nozzle with a highest priority is changed to a use-nozzle.

8. The method of claim 1,
wherein in the nozzle supplement setting, a defective nozzle for which an inspection result falls within use criteria is changed to a reserve nozzle.

9. The method of claim 1,
wherein in a case of insufficient numbers of reserve nozzles in the nozzle supplement setting, maintenance is performed on the nozzles, and
after the maintenance, the initial nozzle setting is performed.

* * * * *